(12) United States Patent
Park et al.

(10) Patent No.: US 11,687,114 B2
(45) Date of Patent: Jun. 27, 2023

(54) CLOCK CONVERTING CIRCUIT WITH SYMMETRIC STRUCTURE

(71) Applicant: Samsung Electronics Co., Ltd., Suwon-si (KR)

(72) Inventors: Junyoung Park, Seoul (KR); Young-Hoon Son, Yongin-si (KR); Hyun-Yoon Cho, Uiwang-si (KR); Youngdon Choi, Seoul (KR); Junghwan Choi, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/145,211

(22) Filed: Jan. 8, 2021

(65) Prior Publication Data

US 2021/0405683 A1 Dec. 30, 2021

(30) Foreign Application Priority Data

Jun. 30, 2020 (KR) .................. 10-2020-0079733

(51) Int. Cl.
*G06F 1/06* (2006.01)
*G11C 11/406* (2006.01)
(Continued)

(52) U.S. Cl.
CPC ............ *G06F 1/06* (2013.01); *G06F 13/4022* (2013.01); *G11C 11/403* (2013.01); *G11C 11/40607* (2013.01)

(58) Field of Classification Search
CPC .......... G06F 1/06; G06F 13/4022; G06F 1/10; G06F 1/12; G06F 13/4243; G11C 11/403; G11C 11/40607; G11C 7/1066; G11C 7/1093; G11C 7/222; G11C 11/4076; H04L 7/0025
(Continued)

(56) References Cited

U.S. PATENT DOCUMENTS 6,107,841 A * 8/2000 Goodnow .................. G06F 1/08
327/407
6,111,446 A * 8/2000 Keeth .................. G11C 7/1051
327/295
(Continued)

FOREIGN PATENT DOCUMENTS

EP 3134973 B1 9/2017
KR 1020080023496 A 3/2008
(Continued)

*Primary Examiner* — Faisal M Zaman
(74) *Attorney, Agent, or Firm* — Muir Patent Law, PLLC

(57) ABSTRACT

Disclosed is a clock converting circuit, which includes a first switch that is connected between a first input node for receiving a second input clock and a first node and operates in response to a first logic state of a first input clock, the second input clock delayed with respect to the first input clock as much as 90 degrees, a second switch that is connected between a second input node for receiving the first input clock and a second node and operates in response to a second logic state of the second input clock, and a third switch that is connected between the second node and a ground node and operates in response to a first logic state of the second input clock opposite to the second logic state of the second input clock.

20 Claims, 30 Drawing Sheets

(51) Int. Cl.
*G11C 11/403* (2006.01)
*G06F 13/40* (2006.01)

(58) Field of Classification Search
USPC .............................. 327/158, 156, 147, 144
See application file for complete search history.

(56) References Cited

U.S. PATENT DOCUMENTS

| | | | | |
|---|---|---|---|---|
| 6,696,874 | B2 * | 2/2004 | Wood | H03K 3/35625 |
| | | | | 327/210 |
| 7,710,794 | B2 | 5/2010 | Kim et al. | |
| 7,786,761 | B2 * | 8/2010 | Lin | G11C 7/02 |
| | | | | 326/82 |
| 8,072,253 | B2 | 12/2011 | Kaeriyama et al. | |
| 8,601,427 | B2 * | 12/2013 | Kawagoe | H03K 5/133 |
| | | | | 716/135 |
| 8,749,289 | B2 | 6/2014 | Li et al. | |
| 9,674,025 | B2 | 6/2017 | Dickson et al. | |
| 9,881,688 | B2 * | 1/2018 | Sasaki | G11C 19/28 |
| 10,050,611 | B2 | 8/2018 | Saito | |
| 10,135,429 | B2 | 11/2018 | Adachi | |
| 10,482,980 | B2 | 11/2019 | Chai | |
| 10,680,606 | B1 * | 6/2020 | Chen | H03K 5/135 |
| 10,832,633 | B2 * | 11/2020 | Park | G06F 1/3293 |
| 2005/0065745 | A1 * | 3/2005 | Jiang | H03L 7/07 |
| | | | | 702/106 |
| 2005/0088210 | A1 * | 4/2005 | Chen | H03K 23/68 |
| | | | | 327/115 |
| 2007/0223638 | A1 | 9/2007 | Okamura | |
| 2007/0247932 | A1 * | 10/2007 | Tobita | G11C 19/28 |
| | | | | 365/189.12 |
| 2007/0283182 | A1 * | 12/2007 | Defazio | G11C 7/1012 |
| | | | | 713/500 |
| 2008/0307241 | A1 * | 12/2008 | Lin | G06F 1/08 |
| | | | | 713/320 |
| 2008/0315950 | A1 * | 12/2008 | Koh | H03F 3/45179 |
| | | | | 330/253 |
| 2009/0154628 | A1 * | 6/2009 | Chen | G09G 3/3677 |
| | | | | 375/371 |
| 2010/0315848 | A1 * | 12/2010 | Buch | H02M 3/07 |
| | | | | 363/62 |
| 2011/0019489 | A1 * | 1/2011 | Huang | G11C 8/18 |
| | | | | 365/194 |
| 2015/0036448 | A1 * | 2/2015 | Ahn | G11C 11/4093 |
| | | | | 365/230.02 |
| 2015/0054558 | A1 * | 2/2015 | Jang | H03K 5/131 |
| | | | | 327/237 |
| 2015/0108963 | A1 * | 4/2015 | Lin | H02M 1/08 |
| | | | | 323/312 |
| 2016/0056763 | A1 * | 2/2016 | Zhao | H03K 3/0231 |
| | | | | 331/111 |
| 2016/0148592 | A1 * | 5/2016 | Lee | G09G 5/006 |
| | | | | 345/520 |
| 2016/0352218 | A1 * | 12/2016 | Stauth | H02M 3/07 |
| 2019/0080735 | A1 * | 3/2019 | Cosemans | G11C 8/18 |
| 2020/0152277 | A1 * | 5/2020 | Min | G11C 16/26 |
| 2020/0235725 | A1 * | 7/2020 | Lee | H03K 7/08 |

FOREIGN PATENT DOCUMENTS

| | | |
|---|---|---|
| KR | 20190024205 A | 3/2019 |
| WO | 2011041155 A1 | 4/2011 |

* cited by examiner

CLOCK CONVERTING CIRCUIT WITH SYMMETRIC STRUCTURE

CROSS-REFERENCE TO RELATED APPLICATIONS

This application claims priority under 35 U.S.C. § 119 to Korean Patent Application No. 10-2020-0079733 filed on Jun. 30, 2020, in the Korean Intellectual Property Office, the disclosure of which is incorporated by reference herein in its entirety.

BACKGROUND

Embodiments of the present disclosure described herein relate to a clock converting circuit, and more particularly, relate to a clock converting circuit in which edge types of an input clock used for duty converting coincide with each other and an output stage has a symmetrical structure.

A memory device may include various circuits for generating, processing, or storing data. For example, the memory device may include various circuits for storing or outputting data based on a clock signal, a data signal, and a command signal. Nowadays, as the amount of data to be processed in a memory device increases, a frequency of a clock signal may increase.

Because it is burdensome to process a clock signal of a high frequency directly at a memory device, the memory device may use a plurality of clock signals having different phases, and the memory device may convert a duty of the clock signal. In this case, a factor such as a skew or a duty error of the converted clock signal may cause an abnormal operation of the memory device or the reduction of reliability of data stored therein. As such, there is desired a clock converting circuit robust to a skew and a duty error of a clock signal.

SUMMARY

Embodiments of the present disclosure provide a clock converting circuit in which edge types of an input clock used for duty converting coincide with each other and an output stage has a symmetrical structure.

According to an example embodiment, a clock converting circuit includes a first switch that is connected between a first input node for receiving a second input clock and a first node and operates in response to a first logic state of a first input clock, the second input clock delayed with respect to the first input clock as much as 90 degrees, a second switch that is connected between a second input node for receiving the first input clock and a second node and operates in response to a second logic state of the second input clock, and a third switch that is connected between the second node and a ground node and operates in response to a first logic state of the second input clock opposite to the second logic state of the second input clock.

According to an example embodiment, a clock converting circuit includes a first clock circuit, a second clock circuit, a third clock circuit, and a fourth clock circuit, wherein the first to fourth clock circuits generate an output four-phase clock including a first output clock, a second output clock, a third output clock, and a fourth output clock, based on an input four-phase clock including a first input clock, a second input clock, a third input clock, and a fourth input clock. The first clock circuit includes a first switch connected between a first input node for receiving the second input clock and a first node and configured to operate in response to a first logic state of the first input clock, a second switch connected between a second input node for receiving the first input clock and a second node and configured to operate in response to a second logic state of the second input clock, and a third switch connected between the second node and a ground node and configured to operate in response to a first logic state of the second input clock opposite to the second logic state of the second input clock.

According to an example embodiment, a clock converting circuit includes a first switch that is connected between a first input node for receiving a first input clock and a first node and operates in response to a first logic state of a second input clock delayed with respect to the first input clock as much as 90 degrees, a second switch that is connected between a second input node for receiving the second input clock and a second node and operates in response to a second logic state of the first input clock, and a third switch that is connected between the first node and a power node and operates in response to a second logic state of the second input clock opposite to the first logic state of the second input clock.

BRIEF DESCRIPTION OF THE FIGURES

The above and other objects and features of the present disclosure will become apparent by describing in detail example embodiments thereof with reference to the accompanying drawings.

DETAILED DESCRIPTION

Figure 1:
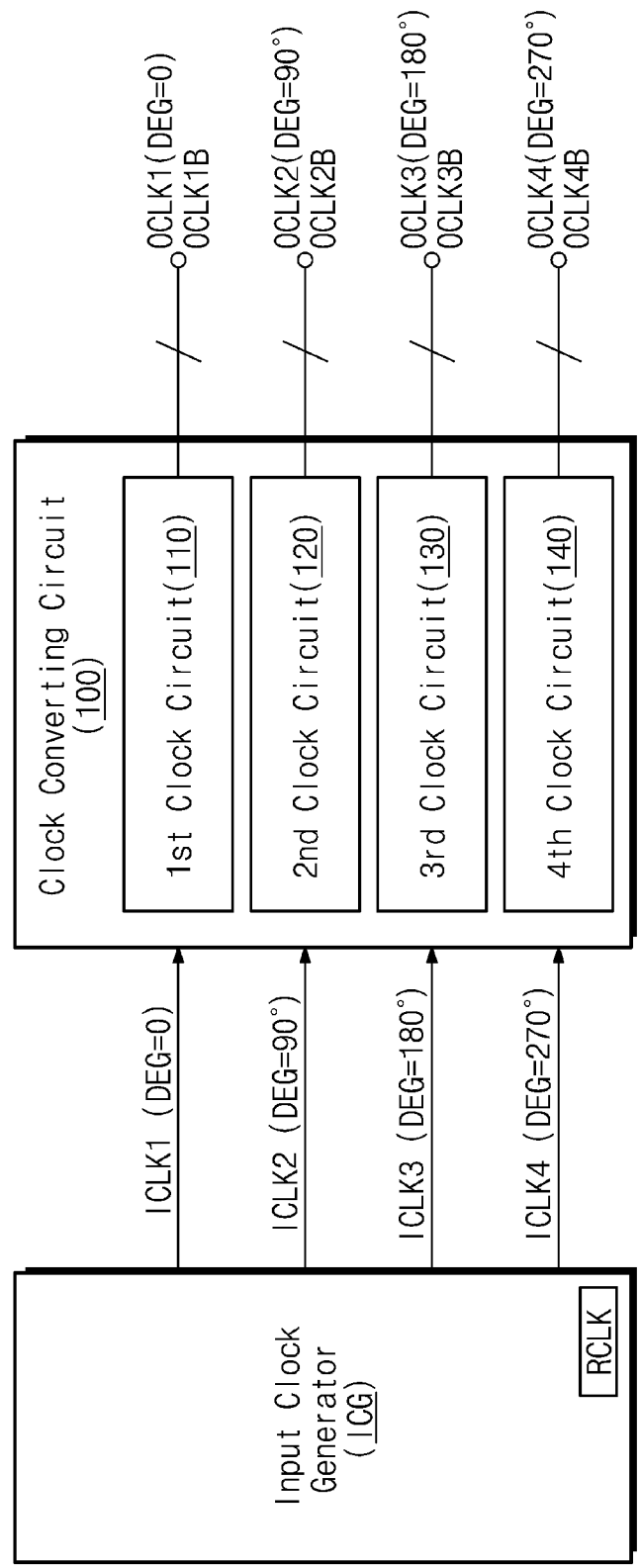
FIG. 1 is a block diagram illustrating a clock converting circuit.

Below, embodiments of the present disclosure may be described in detail and clearly to such an extent that an ordinary one in the art easily implements the present disclosure. Below, for convenience of description, similar components are expressed by using the same or similar reference numerals.

In the following drawings or in the detailed description, modules may be connected with any other components as well as components illustrated in a drawing or described in the detailed description. Modules or components may be connected directly or indirectly. Modules or components may be connected through communication or may be physically connected.

FIG. 1 is a block diagram illustrating a clock converting circuit 100. Referring to FIG. 1, the clock converting circuit 100 receives first to fourth input clocks ICLK1 to ICLK4 from an input clock generator ICG and generates first to fourth output clocks OCLK1 to OCLK4 and first to fourth inverted output clocks OCLK1B to OCLK4B.

Each of the first to fourth input clocks ICLK1 to ICLK4 may be a clock signal in which a first logic state (e.g., a logical high level) and a second logic state (e.g., a logical low level) are repeated at a given period. The first to fourth output clocks OCLK1 to OCLK4 may be clock signals having duties different from those of the first to fourth input clocks ICLK1 to ICLK4. A duty may mean a ratio of a time interval corresponding to the first logic state within a time interval (or a time period) having the first logic state and the second logic state.

The first to fourth inverted output clocks OCLK1B to OCLK4B may be clock signals, logic states of which are opposite to those of the first to fourth output clocks OCLK1 to OCLK4, respectively. This will be more fully described with reference to FIG. 2.

That is, the clock converting circuit 100 may be a circuit that converts duties of the first to fourth input clocks ICLK1 to ICLK4. For example, a duty of the first output clock OCLK1 may be half a duty of the first input clock ICLK1.

The clock converting circuit 100 may receive the first to fourth input clocks ICLK1 to ICLK4 from the input clock generator ICG. The input clock generator ICG may generate the first to fourth input clocks ICLK1 to ICLK4 based on a reference clock RCLK. In this case, the first to fourth input clocks ICLK1 to ICLK4 may be signals that have the same period and the same duty but have different phases.

For example, a phase of the first input clock ICLK1 may be identical to a phase of the reference clock RCLK. A phase of the second input clock ICLK2 may be delayed with respect to the phase of the reference clock RCLK as much as 90 degrees (or the second input clock ICLK2 may be delayed with respect to the reference clock RCLK as much as 90 degrees). A phase of the third input clock ICLK3 may be delayed with respect to the phase of the reference clock RCLK as much as 180 degrees. A phase of the fourth input clock ICLK4 may be delayed with respect to the phase of the reference clock RCLK as much as 270 degrees. That is, the input clock generator ICG may be a device which generates an input four-phase clock including the first to fourth input clocks ICLK1 to ICLK4.

The clock converting circuit 100 may include first to fourth clock circuits 110 to 140. The first clock circuit 110 may generate the first output clock OCLK1 and the first inverted output clock OCLK1B based on the first to fourth input clocks ICLK1 to ICLK4. The second clock circuit 120 may generate the second output clock OCLK2 and the second inverted output clock OCLK2B based on the first to fourth input clocks ICLK1 to ICLK4. The third clock circuit 130 may generate the third output clock OCLK3 and the third inverted output clock OCLK3B based on the first to fourth input clocks ICLK1 to ICLK4. The fourth clock circuit 140 may generate the fourth output clock OCLK4 and the fourth inverted output clock OCLK4B based on the first to fourth input clocks ICLK1 to ICLK4.

For example, the clock converting circuit 100 may be a device that generates an output four-phase clock including the first to fourth output clocks OCLK1 to OCLK4 and an inverted output four-phase clock including the first to fourth inverted output clocks OCLK1B to OCLK4B, based on the input four-phase clock including the first to fourth input clocks ICLK1 to ICLK4.

In an example embodiment, assuming that a duty error or a skew does not exist, the first to fourth output clocks OCLK1 to OCLK4 may be signals that have the same period and the same duty but have different phases. For example, assuming that a phase of the first output clock OCLK1 is 0 degree, phases of the second to fourth output clocks OCLK2 to OLCK4 may be 90 degrees, 180 degrees, and 270 degrees, respectively.

As described above, according to an embodiment of the present disclosure, there may be provided the clock converting circuit 100 that generates an output four-phase clock and an inverted output four-phase clock based on an input four-phase clock.

Figure 2:
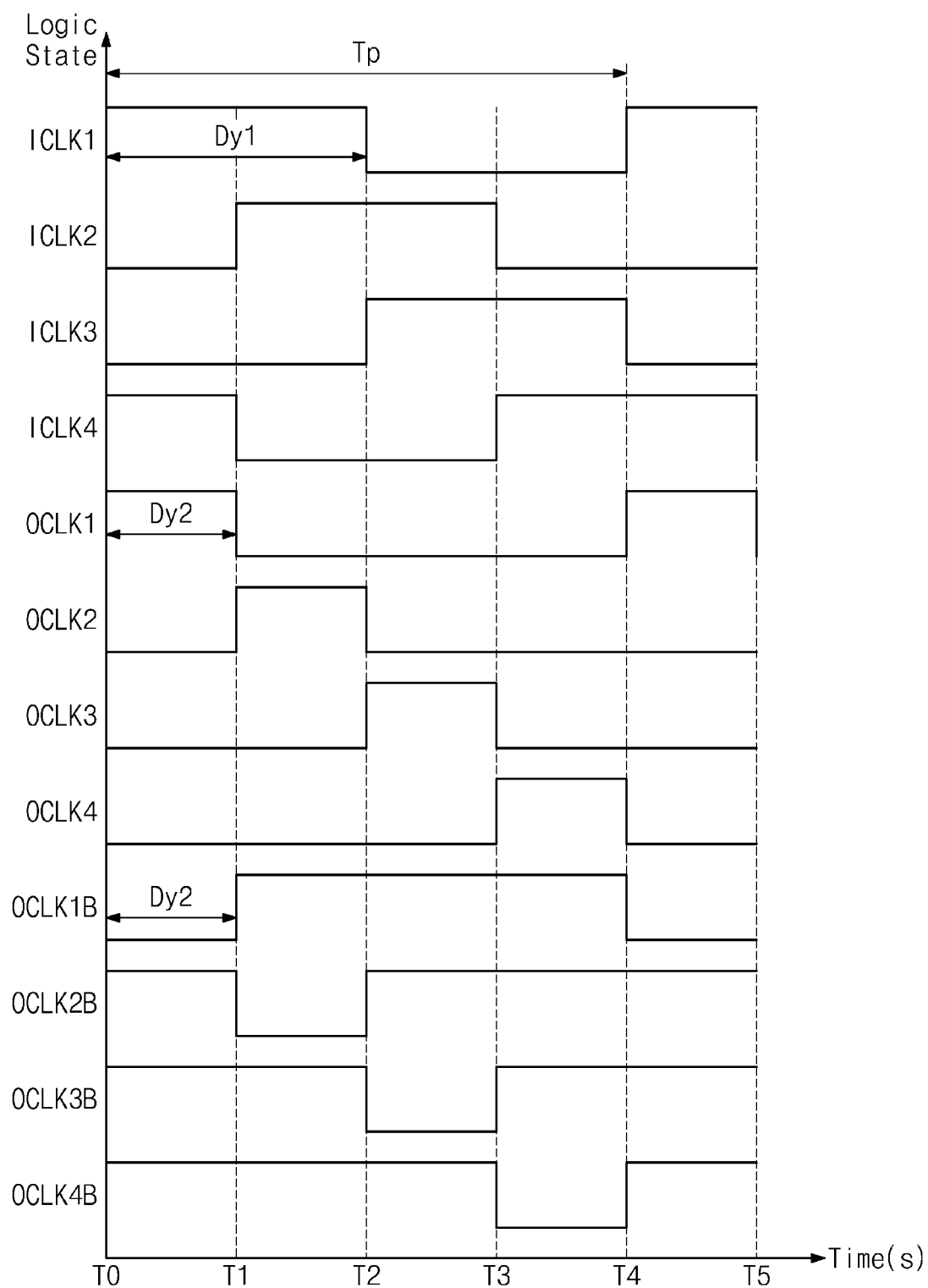
FIG. 2 is a graph illustrating input clocks and output clocks of a clock converting circuit of FIG. 1.

FIG. 2 is a graph illustrating input clocks and output clocks of the clock converting circuit 100 of FIG. 1. Waveforms of the input clocks ICLK1 to ICLK4, waveforms of the output clocks OCLK1 to OCLK4, and waveforms of the inverted output clocks OCLK1B to OCLK4B over time are illustrated in FIG. 2. In the graph of FIG. 2, a transverse direction represents a time. A longitudinal direction represents a logic state.

The first input clock ICLK1 may be a clock signal in which the first logic state and the second logic state are periodically repeated. The first input clock ICLK1 may have a period Tp and a duty Dy1. For example, the period Tp may correspond to a time interval from a time T0 to a time T4. For example, the duty Dy1 may be 50%.

In an example embodiment, the first input clock ICLK1 may have the first logic state in a time interval from the time T0 to a time T2. The first input clock ICLK1 may have the second logic state in a time interval from the time T2 to the time T4. For example, the first logic state may correspond to a logical high level, and the second logic state may correspond to a logical low level.

Phases of the second to fourth input clocks ICLK2 to ICLK4 may be different from the phase of the first input clock ICLK1. For example, a phase of the second input clock ICLK2 may be delayed with respect to the phase of the first input clock ICLK1 as much as 90 degrees. A phase of the third input clock ICLK3 may be delayed with respect to the phase of the first input clock ICLK1 as much as 180 degrees. A phase of the fourth input clock ICLK4 may be delayed with respect to the phase of the first input clock ICLK1 as much as 270 degrees.

In this case, a time interval from the time T0 to the time T1 may correspond to a phase of 90 degrees. A time interval from the time T0 to the time T2 may correspond to a phase of 180 degrees. A time interval from the time T0 to the time T3 may correspond to a phase of 270 degrees.

The first output clock OCLK1 may be a clock signal in which the first logic state and the second logic state are periodically repeated. In this case, a duty Dy2 of the first output clock OCLK1 may be different from the duty Dy1 of the first input clock ICLK1. For example, the duty Dy1 may be 50%, and the duty Dy2 may be 25%.

In an example embodiment, the first output clock OCLK1 may have the first logic state in the time interval from the time T0 to the time T1. The first output clock OCLK1 may have the second logic state in the time interval from the time T1 to the time T4.

Phases of the second to fourth output clocks OCLK2 to OCLK4 may be different from the phase of the first output clock OCLK1. For example, a phase of the second output clock OCLK2 may be delayed with respect to the phase of the first output clock OCLK1 as much as 90 degrees. A phase of the third output clock OCLK3 may be delayed with respect to the phase of the first output clock OCLK1 as much as 180 degrees. A phase of the fourth output clock OCLK4 may be delayed with respect to the phase of the first output clock OCLK1 as much as 270 degrees.

The first to fourth inverted output clocks OCLK1B to OCLK4B may be clock signals, logic states of which are opposite to the logic states of the first to fourth output clocks OCLK1 to OCLK4, respectively. For example, in the time interval from the time T0 to the time T1, the first output clock OCLK1 may have the first logic state, and the first inverted output clock OCLK1B may have the second logic state. For example, in the time interval from the time T1 to the time T4, the first output clock OCLK1 may have the second logic state, and the first inverted output clock OCLK1B may have the first logic state.

Figure 3A:
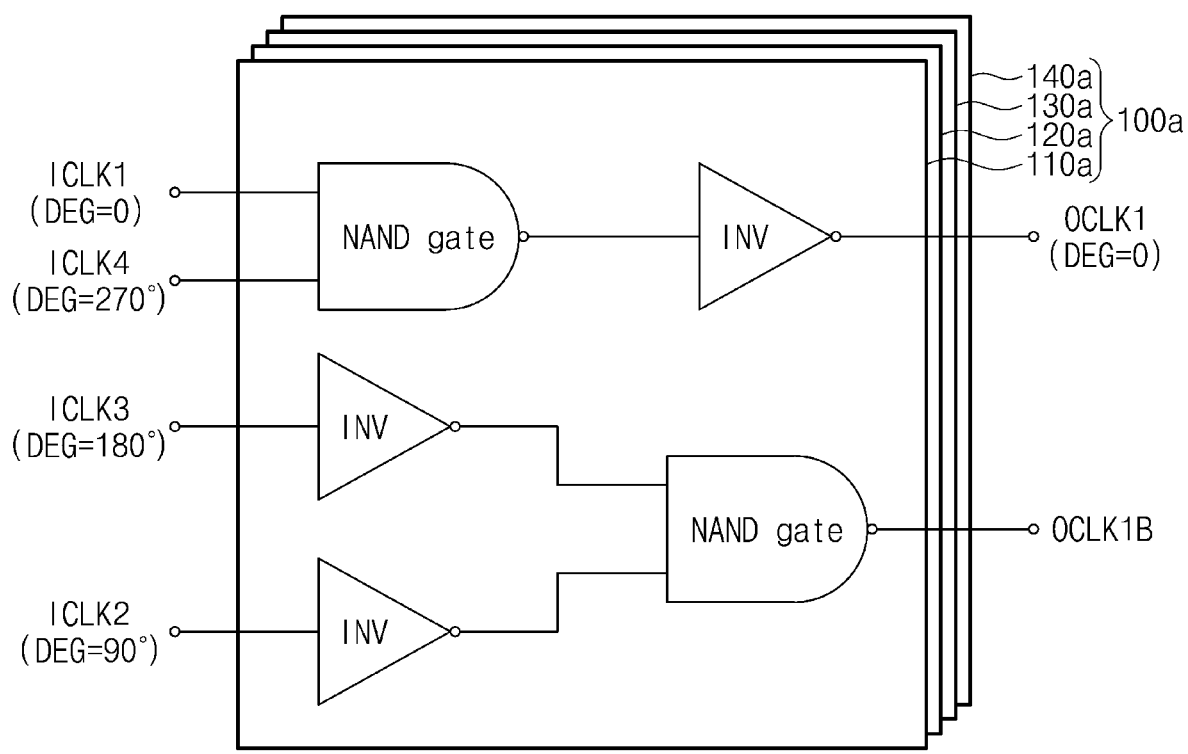
FIG. 3A is a circuit diagram illustrating a clock converting circuit in detail.

FIG. 3A is a circuit diagram illustrating a clock converting circuit 100a in detail. Referring to FIG. 3A, the clock converting circuit 100a may include first to fourth clock circuits 110a to 140a. The first to fourth clock circuits 110a to 140a may output the first to fourth output clocks OCLK1 to OCLK4, respectively.

In detail, the first clock circuit 110a may generate the first output clock OCLK1 and the first inverted output clock OCLK1B based on the first to fourth input clocks ICLK1 to ICLK4. Structures of the second to fourth clock circuits 120a to 140a may be similar to a structure of the first clock circuit 110a. For brevity of illustration, detailed structures of the second to fourth clock circuits 120a to 140a will be omitted.

The first clock circuit 110a may invert a result of a NAND logic operation of the first input clock ICLK1 and the fourth input clock ICLK4 to generate the first output clock OCLK1. The first clock circuit 110a may perform a NAND logic operation on an inverted version of the third input clock ICLK3 and an inverted version of the second input clock ICLK2 to generate the first inverted output clock OCLK1B. However, edge types of the input clocks ICLK1 to ICLK4 used for duty converting may be different, thereby causing a problem in which the first clock circuit 110a may be prone to a duty error of the input clocks ICLK1 to ICLK4. This will be more fully described with reference to FIG. 3B.

Figure 3B:
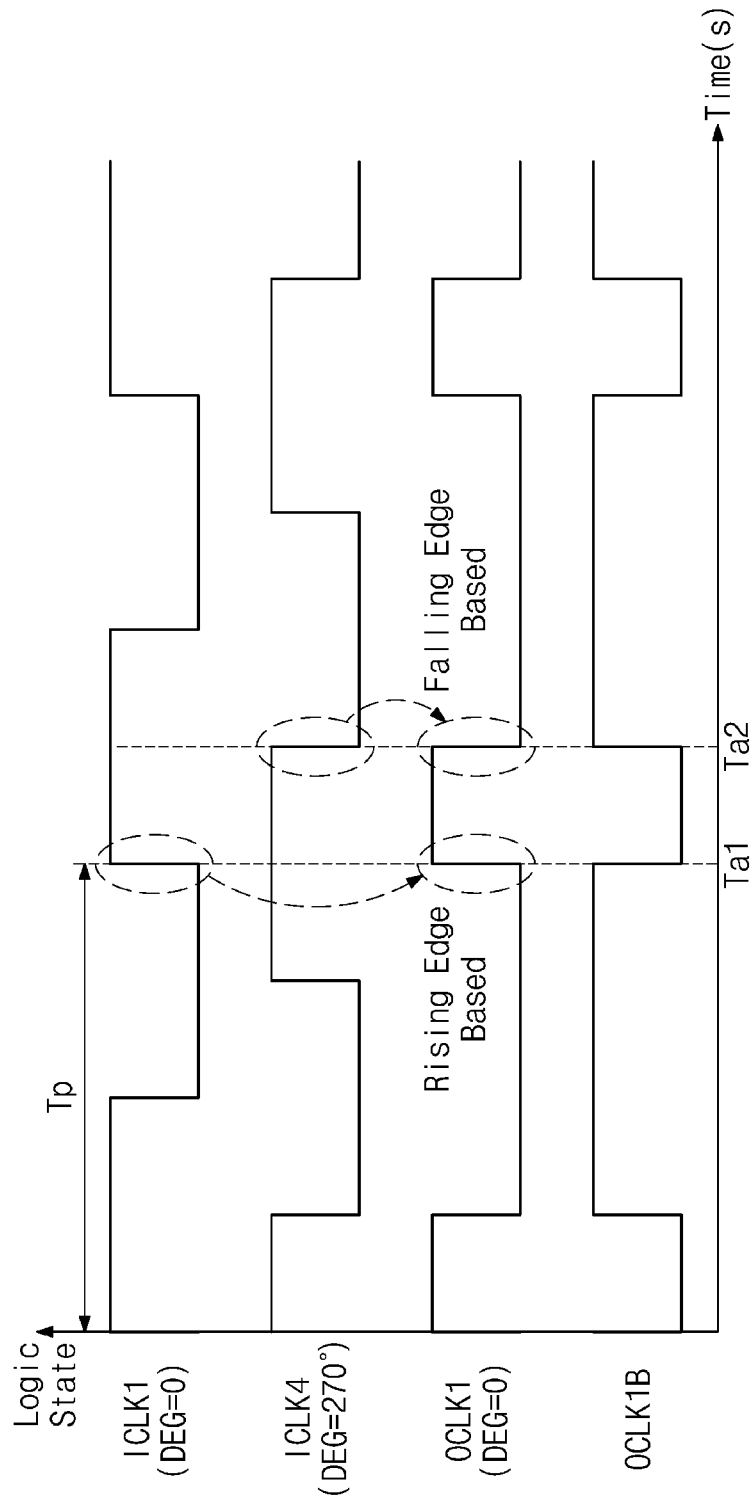
FIG. 3B is a graph illustrating input clocks and output clocks of a clock converting circuit of FIG. 3A.

FIG. 3B is a graph illustrating input clocks and output clocks of the clock converting circuit 100a of FIG. 3A. A waveform of the first input clock ICLK1, a waveform of the fourth input clock ICLK4, a waveform of the first output clock OCLK1, and a waveform of the first inverted output clock OCLK1B are illustrated in FIG. 3B. In the graph of FIG. 3B, a transverse direction represents a time. A longitudinal direction represents a logic state. The first input clock ICLK1 may have the period Tp.

The first clock circuit 110a may perform a NAND logic operation of the first input clock ICLK1 and the fourth input clock ICLK4. At a time Ta1, the first clock circuit 110a may change a logic state of the first output clock OCLK1 based on a rising edge of the first input clock ICLK1. The rising edge may indicate that a logic state of a clock signal switches from a low level to a high level (or a low-to-high transition of a logic state of a clock signal). At a time Ta2, the first clock circuit 110a may change the logic state of the first output clock OCLK1 based on a falling edge of the fourth input clock ICLK4. The falling edge may indicate that a logic state of a clock signal switches from the high level to the low level (or a high-to-low transition of a logic state of a clock signal).

The input clocks ICLK1 to ICLK4 may have a duty error due to a process or degradation of a semiconductor device including the clock converting circuit 100a. The duty error may mean that an actual duty value is different from an intended (or a target) duty value. The clock converting circuit 100a that operates based on different types of edges (i.e., rising and falling edges) may be prone to a duty error of the input clocks ICLK1 to ICLK4. As such, there is desired a technique for generating an output clock based on edges of the same type (i.e., a rising edge or a falling edge).

Figure 4A:
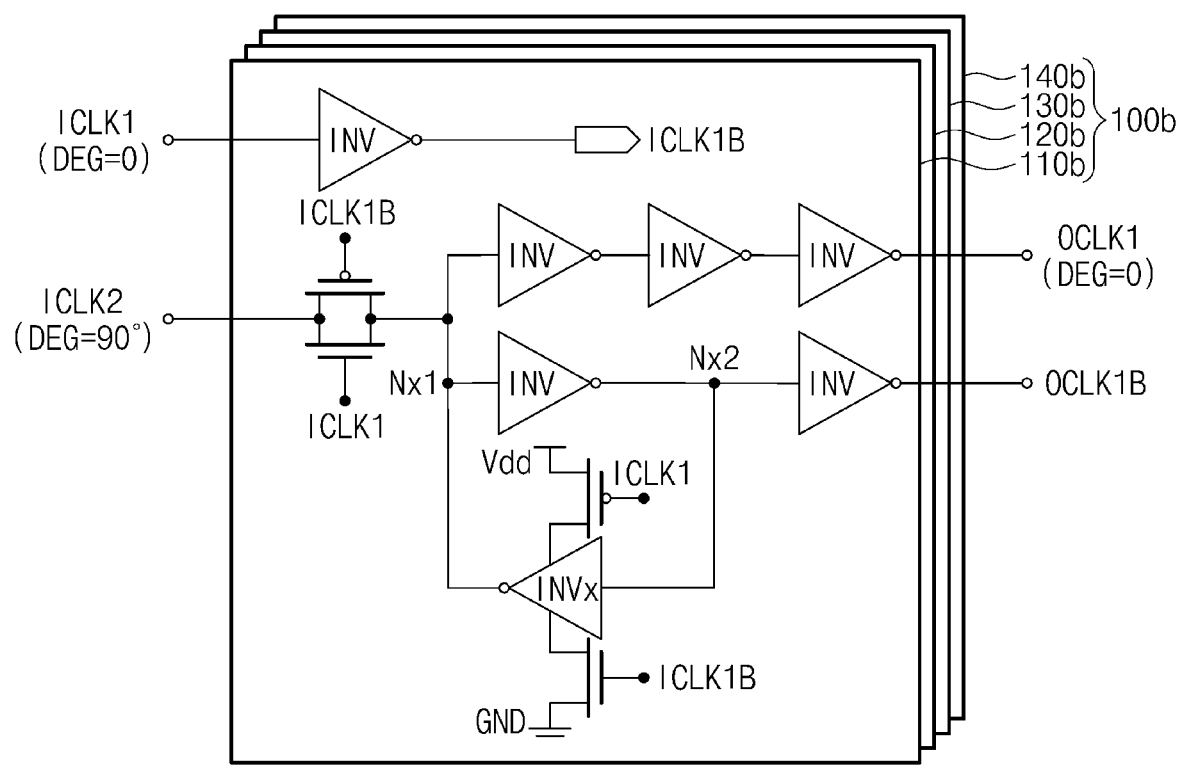
FIG. 4A is a circuit diagram illustrating a clock converting circuit in detail.

FIG. 4A is a circuit diagram illustrating a clock converting circuit 100b in detail. Referring to FIG. 4A, the clock converting circuit 100b may include first to fourth clock circuits 110b to 140b. The first to fourth clock circuits 110b to 140b output the first to fourth output clocks OCLK1 to OCLK4, respectively. The first clock circuit 110b may generate the first output clock OCLK1 and the first inverted output clock OCLK1B based on the first and second input clocks ICLK1 and ICLK2.

Structures of the second to fourth clock circuits 120b to 140b may be similar to a structure of the first clock circuit 110b. For brevity of illustration, detailed structures of the second to fourth clock circuits 120b to 140b will be omitted.

When the first input clock ICLK1 has the first logic state being the high level, the first clock circuit 110b may provide the second input clock ICLK2 to a node Nx1. When the first input clock ICLK1 has the second logic state, the first clock circuit 110b may feed a voltage of a node Nx2 back to the node Nx1 through an inverter INVx. The inverter INVx may be driven based on a power supply voltage Vdd and a ground GND. A voltage of a waveform similar to that of the first inverted output clock OCLK1B may be formed at the node Nx1.

The first clock circuit 110b may generate both the first output clock OCLK1 and the first inverted output clock OCLK1B based on the voltage of the node Nx1. That is, unlike the first clock circuit 110a of FIG. 3A, the first clock circuit 110b may generate the first output clock OCLK1 and the first inverted output clock OCLK1B based on edges of the same type.

However, in the first clock circuit 110b, as an output stage (e.g., inverters INV) connected to the node Nx1 has an asymmetric structure, a time error may occur between the first output clock OCLK1 and the first inverted output clock OCLK1B. This will be more fully described with reference to FIG. 4B.

Figure 4B:
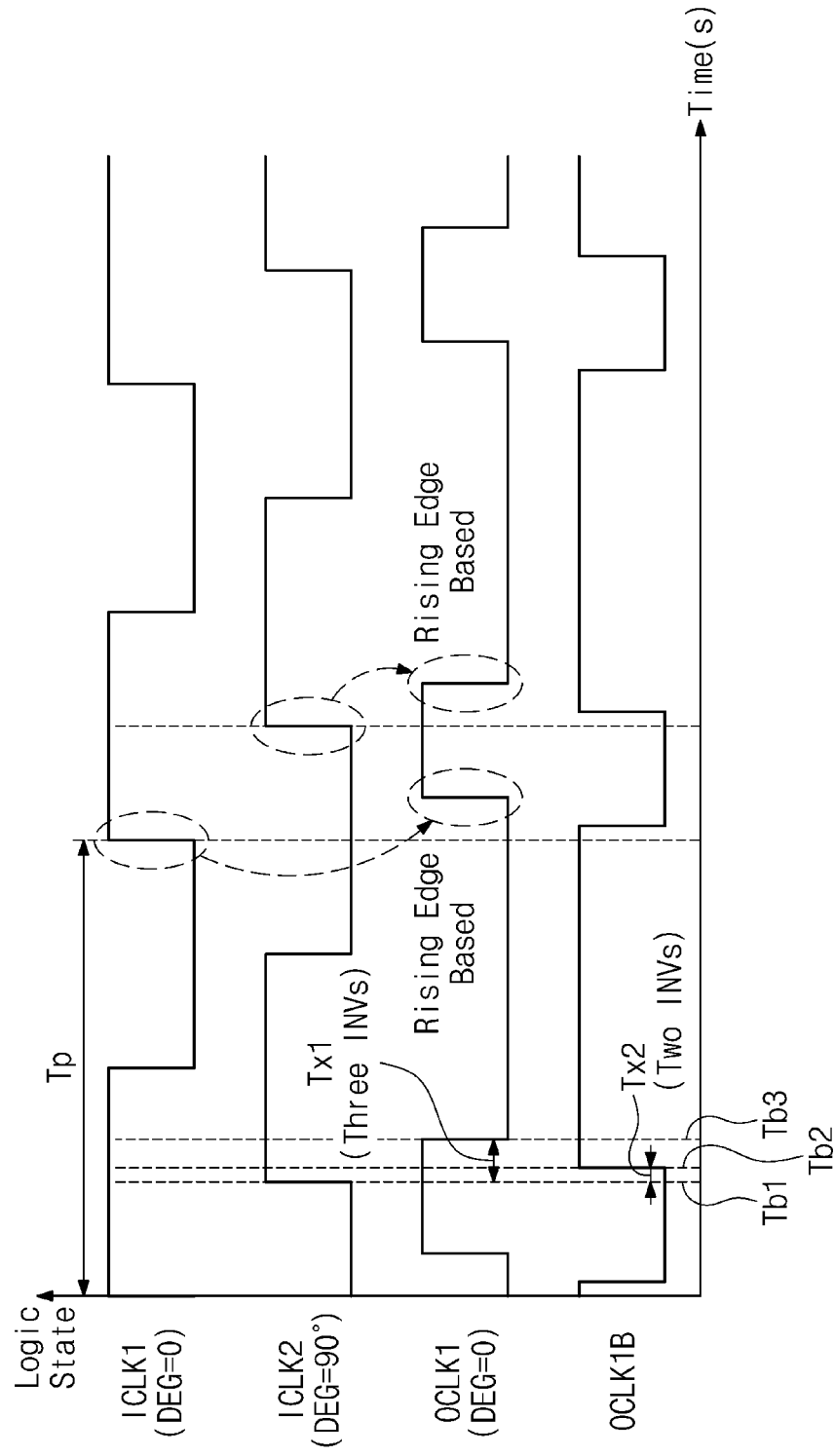
FIG. 4B is a graph illustrating input clocks and output clocks of a clock converting circuit of FIG. 4A.

FIG. 4B is a graph illustrating input clocks and output clocks of the clock converting circuit 100b of FIG. 4A. A waveform of the first input clock ICLK1, a waveform of the second input clock ICLK2, a waveform of the first output clock OCLK1, and a waveform of the first inverted output clock OCLK1B are illustrated in FIG. 4B. In the graph of FIG. 4B, a transverse direction represents a time. A longitudinal direction represents a logic state. The first input clock ICLK1 may have the period Tp.

The first clock circuit 110b may generate the first output clock OCLK1 and the first inverted output clock OCLK1B based on the rising edge of the first input clock ICLK1 and the rising edge of the second input clock ICLK2. That is, because the first clock circuit 110b operates based on edges of the same type (i.e., rising edge), the first clock circuit 110b may be robust to a duty error of the input clocks ICLK1 and ICLK2.

As an output stage (e.g., inverters INV) connected to the node Nx1 of the first clock circuit 110b has an asymmetric structure, a skew may occur. In detail, the first output clock OCLK1 may be generated by three inverters INV connected in series to the node Nx1. The first inverted output clock OCLK1B may be generated by two inverters INV connected in series to the node Nx1. Because a time delayed by the three inverters INV is different from a time delayed by the two inverters INV, a skew may occur between the first output clock OCLK1 and the first inverted output clock OCLK1B.

For example, the first output clock OCLK1 generated by the serially-connected three inverters INV may be delayed by operations of the three inverters INV as much as a time interval Tx1. The time interval Tx1 may be an interval from a time Tb1 to a time Tb3. The first inverted output clock OCLK1B generated by the serially-connected two inverters INV may be delayed by operations of the two inverters INV as much as a time interval Tx2. The time interval Tx2 may be an interval from the time Tb1 to a time Tb2. Here, the time interval Tx1 may be longer than the time interval Tx2.

As described above, the first clock circuit 110b may be advantageous in that the first clock circuit 110b operates based on edges of the same type but may be disadvantageous in that a skew may occur between the first output clock OCLK1 and the first inverted output clock OCLK1B due to an output stage of an asymmetric structure. As such, there is needed a clock circuit that generates an output clock based on edges of the same type and has a symmetric structure.

Figure 5A:
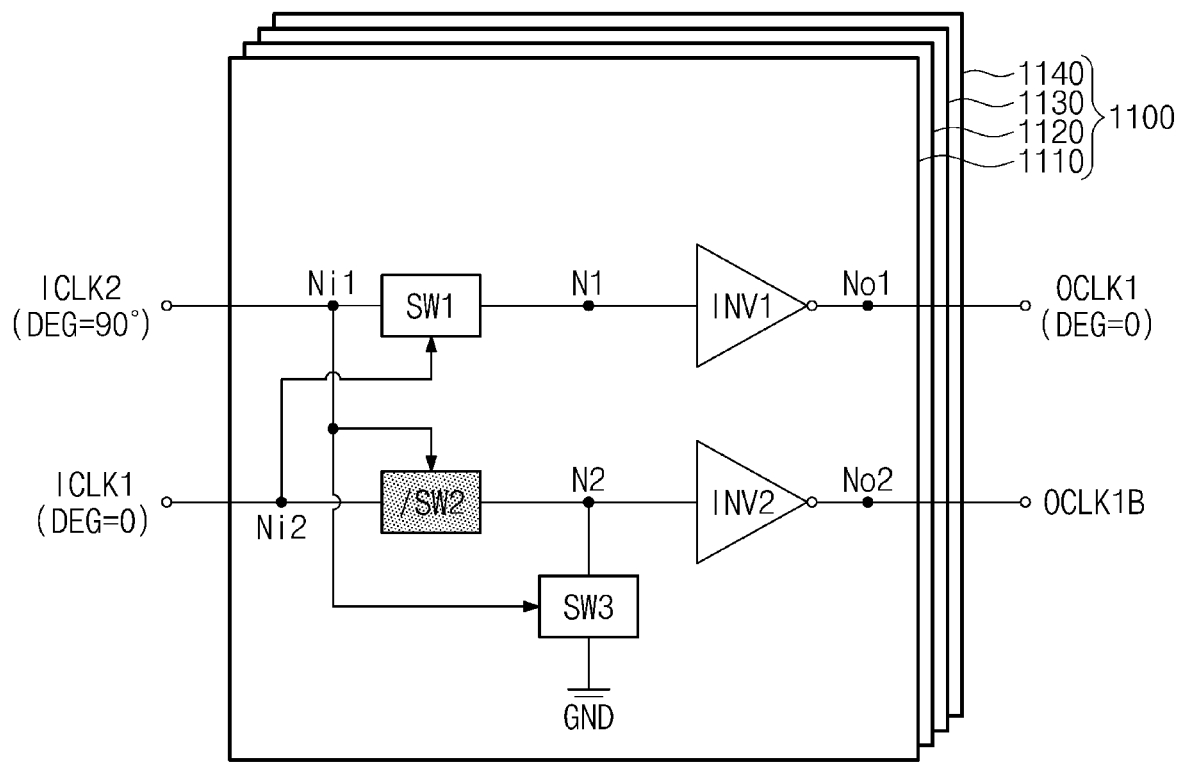
FIG. 5A is a block diagram illustrating a clock converting circuit according to an embodiment of the present disclosure in detail.

FIG. 5A is a block diagram illustrating a clock converting circuit 1100 according to an embodiment of the present disclosure in detail. Referring to FIG. 5A, the clock converting circuit 1100 may include first to fourth clock circuits 1110 to 1140. The first clock circuit 1110 may generate the first output clock OCLK1 and the first inverted output clock OCLK1B based on the first input clock ICLK1 and the second input clock ICLK2. Structures of the second to fourth clock circuits 1120 to 1140 will be more fully described with reference to FIG. 5C.

The first clock circuit 1110 may include a first switch SW1, a second switch /SW2, a third switch SW3, a first inverter INV1, and a second inverter INV2. Here, a mark "/" of the second switch /SW2 may mean that the second switch /SW2 operates in response to an inverted logic state. For example, in the case where a clock signal sequentially having the first logic state and the second logic state is applied to the first switch SW1 and the second switch /SW2, the first switch SW1 may be turned on in a time interval where the clock signal is in the first logic state, and the second switch /SW2 may be turned on in a time interval where the clock signal is in the second logic state.

The first clock circuit 1110 may receive the second input clock ICLK2 through a first input node Ni1. The first clock circuit 1110 may receive the first input clock ICLK1 through a second input node Ni2. The first clock circuit 1110 may output the first output clock OCLK1 through a first output node No1. The first clock circuit 1110 may output the first inverted output clock OCLK1B through a second output node No2.

The first input clock ICLK1 and the second input clock ICLK2 may be clock signals which have the same period and the same duty and in which the first logic state and the second logic state are periodically repeated. A phase of the second input clock ICLK2 may be delayed with respect to a phase of the first input clock ICLK1 as much as 90 degrees. The first output clock OCLK1 may be a clock signal that has the same period as the first input clock ICLK1 and has a duty shorter than the first input clock ICLK1. The first inverted output clock OCLK1B may be a clock signal, a logic state of which is opposite to that of the first output clock OCLK1.

The first switch SW1 may be connected between the first input node Ni1 and a first node N1. The first switch SW1 may operate in response to the first logic state of the first input clock ICLK1 on the second input node Ni2.

For example, the first switch SW1 may be turned on in a time interval where the first input clock ICLK1 has the first logic state (e.g., the logical high level) and may be turned off in a time interval where the first input clock ICLK1 has the second logic state (e.g., the logical low level), but the present disclosure is not limited thereto.

The second switch /SW2 may be connected between the second input node Ni2 and a second node N2. The second switch /SW2 may operate in response to the second logic state of the second input clock ICLK2 on the first input node Ni1.

For example, the second switch /SW2 may be turned on in a time interval where the second input clock ICLK2 has the second logic state (e.g., the logical low level) and may be turned off in a time interval where the second input clock ICLK2 has the first logic state (e.g., the logical high level), but the present disclosure is not limited thereto.

The third switch SW3 may be connected between the second node N2 and a ground node. The ground node may be a node to which the ground GND is provided. The ground GND may be a voltage corresponding to the second logic state (e.g., the logical low level). The third switch SW3 may operate in response to the first logic state of the second input clock ICLK2 on the first input node Ni1.

For example, the third switch SW3 may be turned on in a time interval where the second input clock ICLK2 has the first logic state (e.g., the logical high level) and may be turned off in a time interval where the second input clock ICLK2 has the second logic state (e.g., the logical low level), but the present disclosure is not limited thereto.

The first inverter INV1 may be connected between the first node N1 and the first output node No. The first inverter INV1 may invert a voltage of the first node N1 and may output the inverted voltage to the first output node No1. To invert a voltage may mean to invert a logic state. For example, when a voltage at the first node N1 corresponds to the first logic state, the first inverter INV1 may output a voltage corresponding to the second logic state to the first output node No1. When the voltage at the first node N1 corresponds to the second logic state, the first inverter INV1 may output a voltage corresponding to the first logic state to the first output node No1.

The second inverter INV2 may be connected between the second node N2 and the second output node No2. The second inverter INV2 may invert a voltage of the second node N2 and may output the inverted voltage to the second output node No2.

Output stages of the clock converting circuit 1100 according to an embodiment of the present disclosure may have a symmetric structure. For example, one switch and one inverter may be interposed between the first output node No1 from which the first output clock OCLK1 is generated and the first input node Ni1. One switch and one inverter may be interposed between the second output node No2 from which the first inverted output clock OCLK1B is generated and the second input node Ni2. Because the number of elements (including a switch and an inverter) for the first output clock OCLK1 is equal to the number of elements (including a switch and an inverter) for the first inverted output clock OCLK1B, a skew between the first output clock OCLK1 and the first inverted output clock OCLK1B may be suppressed.

The clock converting circuit 1100 according to an embodiment of the present disclosure may include the first clock circuit 1110 that generates the first output clock OCLK1 and the first inverted output clock OCLK1B based on edges of the same type. A process in which the first clock circuit 1110 of the clock converting circuit 1100 generates the first output clock OCLK1 and the first inverted output clock OCLK1B will be described with reference to FIG. 5B.

Figure 5B:
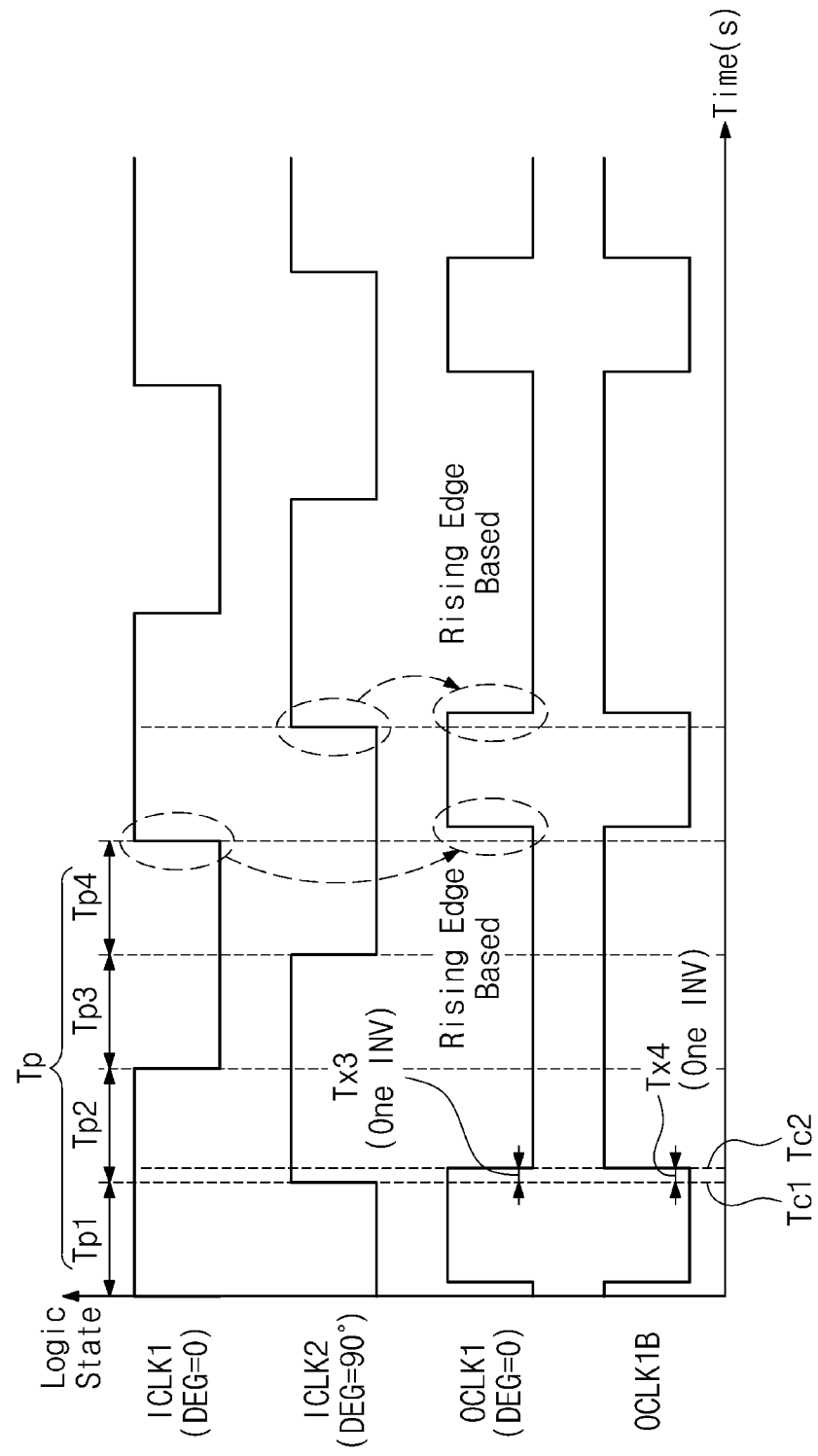
FIG. 5B is a graph illustrating input clocks and output clocks of a clock converting circuit of FIG. 5A according to example embodiments.

FIG. 5B is a graph illustrating input clocks and output clocks of the clock converting circuit 1100 of FIG. 5A according to example embodiments. A waveform of the first input clock ICLK1, a waveform of the second input clock ICLK2, a waveform of the first output clock OCLK1, and a waveform of the first inverted output clock OCLK1B are illustrated in FIG. 5B. In the graph of FIG. 5B, a transverse direction represents a time. A longitudinal direction represents a logic state.

The first input clock ICLK1 may have the period Tp. The period Tp may include first to fourth time intervals Tp1 to Tp4. The first time interval Tp1 may be a time interval from a phase of 0 degree to a phase of 90 degrees. The second time interval Tp2 may be a time interval from a phase of 90 degrees to a phase of 180 degrees. The third time interval Tp3 may be a time interval from a phase of 180 degrees to a phase of 270 degrees. The fourth time interval Tp4 may be a time interval from a phase of 270 degrees to a phase of 360 degrees.

In an example embodiment, a voltage waveform at the first node N1 may be similar to a voltage waveform of the first inverted output clock OCLK1B. The voltage waveform at the first node N1 may be based on the rising edge of the first input clock ICLK1 and the rising edge of the second input clock ICLK2.

For example, in the first time interval Tp1, the first switch SW1 may be turned on, but the second input clock ICLK2 may have the second logic state. In this case, the first node N1 may have a voltage corresponding to the second logic state. In the second time interval Tp2, the first switch SW1 may maintain a turn-on state, and the second input clock ICLK2 may have the first logic state. In this case, the first node N1 may have a voltage corresponding to the first logic state. Because the first switch SW1 is turned off in the third and fourth time intervals Tp3 and Tp4, the first node N1 may maintain the voltage of the second time interval Tp2 in the third and fourth time intervals Tp3 and Tp4.

In an example embodiment, the first inverter INV1 may generate the first output clock OCLK1 based on the voltage of the first node N1. Due to the first inverter INV1, the first output clock OCLK1 may be delayed with respect to the first input clock ICLK1 as much as a time interval Tx3. The time interval Tx3 may be an interval from a time Tc1 to a time Tc2.

In an example embodiment, a voltage waveform at the second node N2 may be similar to a voltage waveform of the first output clock OCLK1. The voltage waveform at the second node N2 may be based on the rising edge of the first input clock ICLK1 and the rising edge of the second input clock ICLK2.

For example, in the first time interval Tp1, the second switch /SW2 may be turned on, the third switch SW3 may be turned off, and the first input clock ICLK1 may have the first logic state. In this case, the second node N2 may have a voltage corresponding to the first logic state. For example, in the second and third time intervals Tp2 and Tp3, the second switch /SW2 may be turned off, the third switch SW3 may be turned on, and the ground GND may be provided to the second node N2 through the turned-on switch SW3. In this case, the second node N2 may have a voltage corresponding to the second logic state. In the fourth time interval Tp4, the second switch /SW2 may be turned on, the third switch SW3 may be turned off, and the first input clock ICLK1 may have the second logic state. In this case, the second node N2 may have a voltage corresponding to the second logic state.

In an example embodiment, the second inverter INV2 may generate the first inverted output clock OCLK1B based on the voltage of the second node N2. Due to the second inverter INV2, the first inverted output clock OCLK1B may be delayed with respect to the first input clock ICLK1 as much as a time interval Tx4. The time interval Tx4 may be an interval from the time Tc1 to the time Tc2.

Unlike the first clock circuit 110b of FIG. 4A, the first clock circuit 1110 may be configured in such a way that the number of inverters for the first output clock OCLK1 is equal to the number of inverters for the first inverted output clock OCLK1B, and thus, the time interval Tx4 may be equal to the time interval Tx3. For example, as the first clock circuit 1110 has a symmetric structure, a skew between the first output clock OCLK1 and the first inverted output clock OCLK1B may be suppressed at the first clock circuit 1110.

As described above, according to an embodiment of the present disclosure, there is provided the first clock circuit 1110 that generates an output clock based on edges of the same type and has a symmetric structure. For example, this characteristic is also applied to the second to fourth clock circuits 1120 to 1140 of the clock converting circuit 1100, not limited to the first clock circuit 1110. Characteristics of the second to fourth clock circuits 1120 to 1140 will be more fully described with reference to FIG. 5C.

Figure 5C:
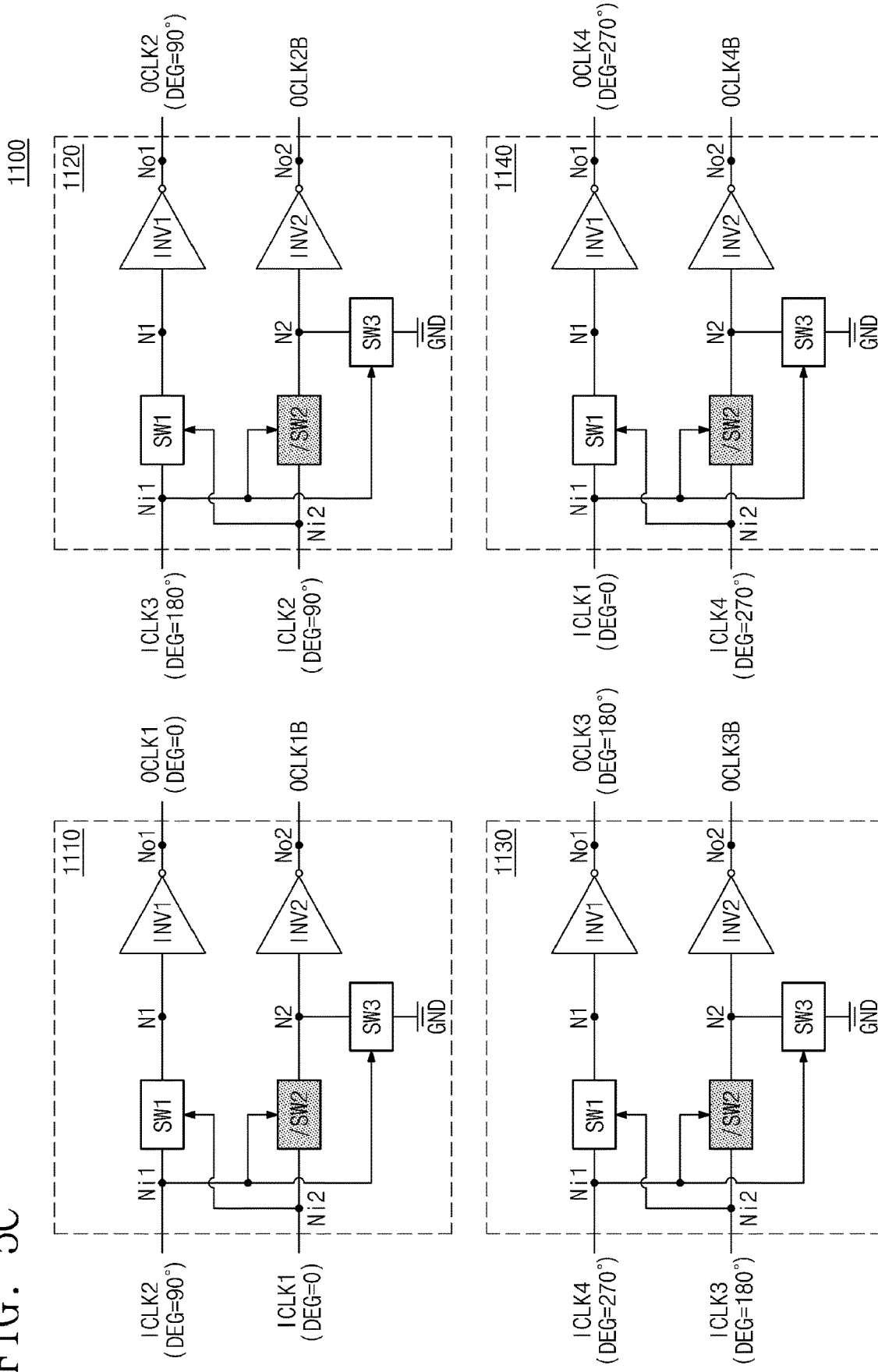
FIG. 5C is a block diagram illustrating first to fourth clock circuits of FIG. 5A in detail according to example embodiments.

FIG. 5C is a block diagram illustrating the first to fourth clock circuits 1110 to 1140 of FIG. 5A in detail according to example embodiments. The clock converting circuit 1100 including the first to fourth clock circuits 1110 to 1140 is illustrated in FIG. 5C. The switches SW1, /SW2, and SW3 and the inverters INV1 and INV2 of the first clock circuit 1110 in FIG. 5C are similar to the switches SW1, /SW2, and SW3 and the inverters INV1 and INV2 of the first clock circuit 1110 of FIG. 5A, and thus, additional description will be omitted to avoid redundancy.

Referring to FIG. 5C, the switches SW1, /SW2, and SW3 and the inverters INV1 and INV2 of each of the second to fourth clock circuits 1120 to 1140 may be similar to the switches SW1, /SW2, and SW3 and the inverters INV1 and INV2 of the first clock circuit 1110. However, the second to fourth clock circuits 1120 to 1140 may be different from the first clock circuit 1110 in terms of input clocks provided to the input nodes Ni1 and Ni2 and output clocks generated at the output nodes No1 and No2.

The second clock circuit 1120 may receive the third input clock ICLK3 through the first input node Ni1. The second clock circuit 1120 may receive the second input clock ICLK2 through the second input node Ni2. The second clock circuit 1120 may generate the second output clock OCLK2 and the second inverted output clock OCLK2B based on the second and third input clocks ICLK2 and ICLK3. The second clock circuit 1120 may output the second output clock OCLK2 through the first output node No1. The second clock circuit 1120 may output the second inverted output clock OCLK2B through the second output node No2.

A phase of the second input clock ICLK2 may be delayed with respect to the phase of the first input clock ICLK1 as much as 90 degrees. A phase of the third input clock ICLK3 may be delayed with respect to the phase of the first input clock ICLK1 as much as 180 degrees. A phase of the second output clock OCLK2 may be delayed with respect to the phase of the first output clock OCLK1 of the first clock circuit 1110 as much as 90 degrees. The second inverted output clock OCLK2B may be a signal, a logic state of which is opposite to that of the second output clock OCLK2.

The third clock circuit 1130 may receive the fourth input clock ICLK4 through the first input node Ni1. The third clock circuit 1130 may receive the third input clock ICLK3 through the second input node Ni2. The third clock circuit 1130 may generate the third output clock OCLK3 and the third inverted output clock OCLK3B based on the third and fourth input clocks ICLK3 and ICLK4. The third clock circuit 1130 may output the third output clock OCLK3 through the first output node No1. The third clock circuit 1130 may output the third inverted output clock OCLK3B through the second output node No2.

A phase of the fourth input clock ICLK4 may be delayed with respect to the phase of the first input clock ICLK1 as much as 270 degrees. A phase of the third output clock OCLK3 may be delayed with respect to the phase of the first output clock OCLK1 of the first clock circuit 1110 as much as 180 degrees. The third inverted output clock OCLK3B may be a signal, a logic state of which is opposite to that of the third output clock OCLK3.

The fourth clock circuit 1140 may receive the first input clock ICLK1 through the first input node Ni1. The fourth clock circuit 1140 may receive the fourth input clock ICLK4 through the second input node Ni2. The fourth clock circuit 1140 may generate the fourth output clock OCLK4 and the fourth inverted output clock OCLK4B based on the fourth and first input clocks ICLK4 and ICLK1. The fourth clock circuit 1140 may output the fourth output clock OCLK4 through the first output node No1. The fourth clock circuit 1140 may output the fourth inverted output clock OCLK4B through the second output node No2.

A phase of the fourth input clock ICLK4 may be delayed with respect to the phase of the first input clock ICLK1 as much as 270 degrees. A phase of the fourth output clock OCLK4 may be delayed with respect to the phase of the first output clock OCLK1 of the first clock circuit 1110 as much as 270 degrees. The fourth inverted output clock OCLK4B may be a signal, a logic state of which is opposite to that of the fourth output clock OCLK4.

In an example embodiment, in the clock converting circuit 1100, nodes for receiving the same input clock may be implemented with one node. For example, the first input node Ni1 of the first clock circuit 1110 may be the second input node Ni2 of the second clock circuit 1120. The first input node Ni1 of the second clock circuit 1120 may be the second input node Ni2 of the third clock circuit 1130. The first input node Ni1 of the third clock circuit 1130 may be the second input node Ni2 of the fourth clock circuit 1140. The first input node Ni1 of the fourth clock circuit 1140 may be the second input node Ni2 of the first clock circuit 1110.

As described above, according to an embodiment of the present disclosure, there is provided the clock converting circuit 1100 that generates an output clock based on edges of the same type and includes the first to fourth clock circuits 1110 to 1140 each having a symmetric structure. The clock converting circuit 1100 that operates based on the rising edge is disclosed in FIGS. 5A to 5C. However, edges of the same type (e.g., the rising edge) described above are not limited thereto. For example, a clock converting circuit 2100 that operates based on the falling edge will be described with reference to FIGS. 12A to 12C.

Figure 6:
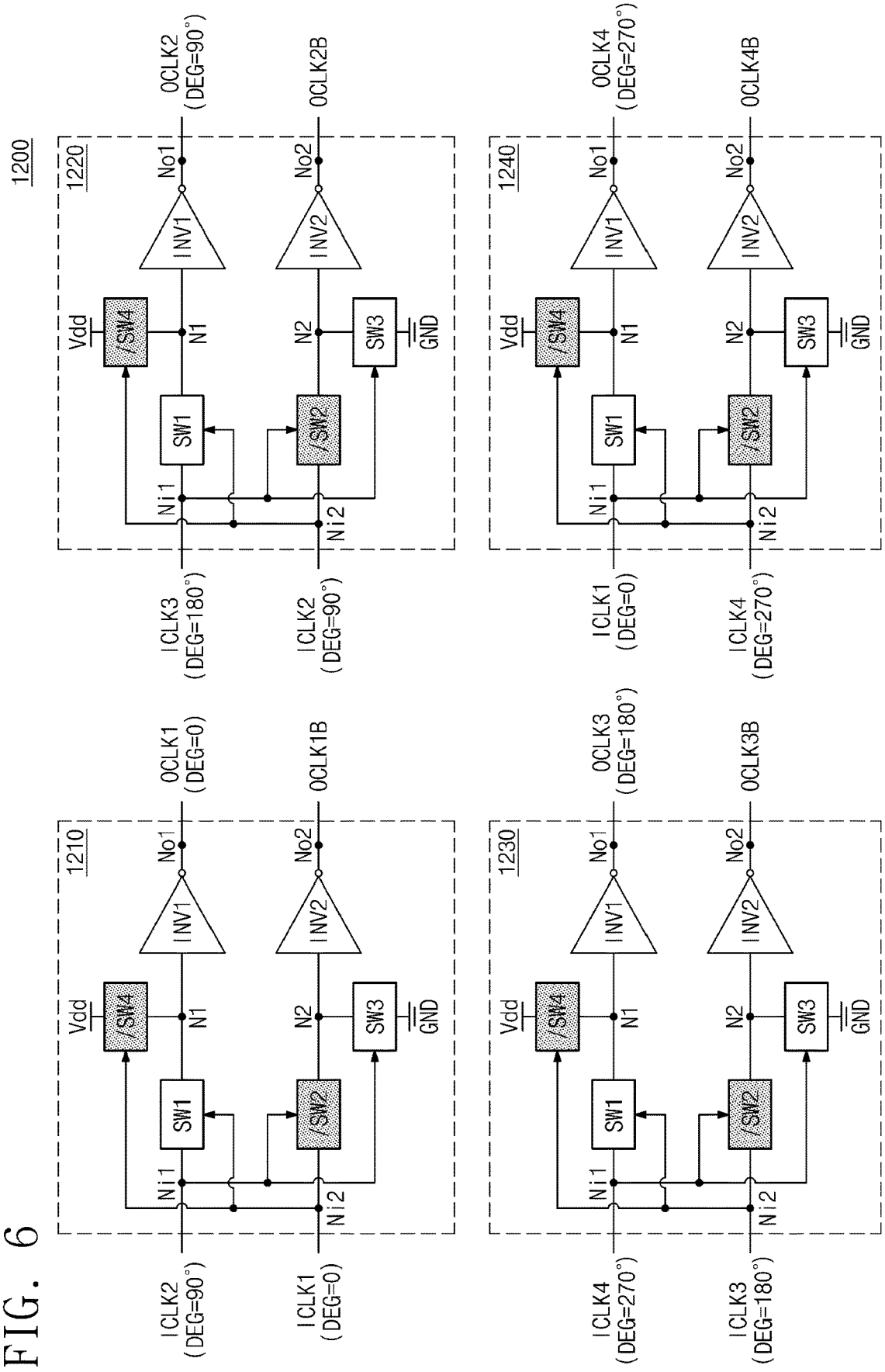
FIG. 6 is a block diagram illustrating a clock converting circuit according to an embodiment of the present disclosure in detail.

FIG. 6 is a block diagram illustrating a clock converting circuit 1200 according to an embodiment of the present disclosure in detail. Referring to FIG. 6, the clock converting circuit 1200 may include first to fourth clock circuits 1210 to 1240. Each of the first to fourth clock circuits 1210 to 1240 may include switches SW1, /SW2, SW3, and /SW4 and inverters INV1 and INV2.

The switches SW1, /SW2, and SW3 and the inverters INV1 and INV2 of each of the first to fourth clock circuits 1210 to 1240 are similar to the switches SW1, /SW2, and SW3 and the inverters INV1 and INV2 of each of the first to fourth clock circuits 1110 to 1140 of FIG. 5C, and thus, additional description will be omitted to avoid redundancy.

Unlike the first to fourth clock circuits 1110 to 1140 of FIG. 5C, each of the first to fourth clock circuits 1210 to 1240 may further include the fourth switch /SW4 connected between the first node N1 and a power node. The power node may be a node to which the power supply voltage Vdd is provided. The power supply voltage Vdd may be a voltage corresponding to the first logic state (e.g., the logical high level). The fourth switch /SW4 may be used to maintain a voltage of the first node N1 stably. The fourth switch /SW4 may operate in response to the second logic state of an input clock applied to the second input node Ni2.

In an example embodiment, the fourth switch /SW4 of the first clock circuit 1210 may be connected between the first node N1 and the power node and may operate in response to the second logic state of the first input clock ICLK1 on the second input node Ni2.

For example, the fourth switch /SW4 may be turned on in a time interval where the first input clock ICLK1 has the second logic state (e.g., the logical low level) and may be turned off in a time interval where the first input clock ICLK1 has the first logic state (e.g., the logical high level), but the present disclosure is not limited thereto.

As described above, according to an embodiment of the present disclosure, in a time interval where the first input clock ICLK1 has the second logic state, the fourth switch /SW4 may provide the power supply voltage Vdd to the first node N1, and thus, a voltage of the first node N1 may be stably maintained in a specific time interval (e.g., Tp3 and Tp4 of FIG. 5B).

Figure 7:
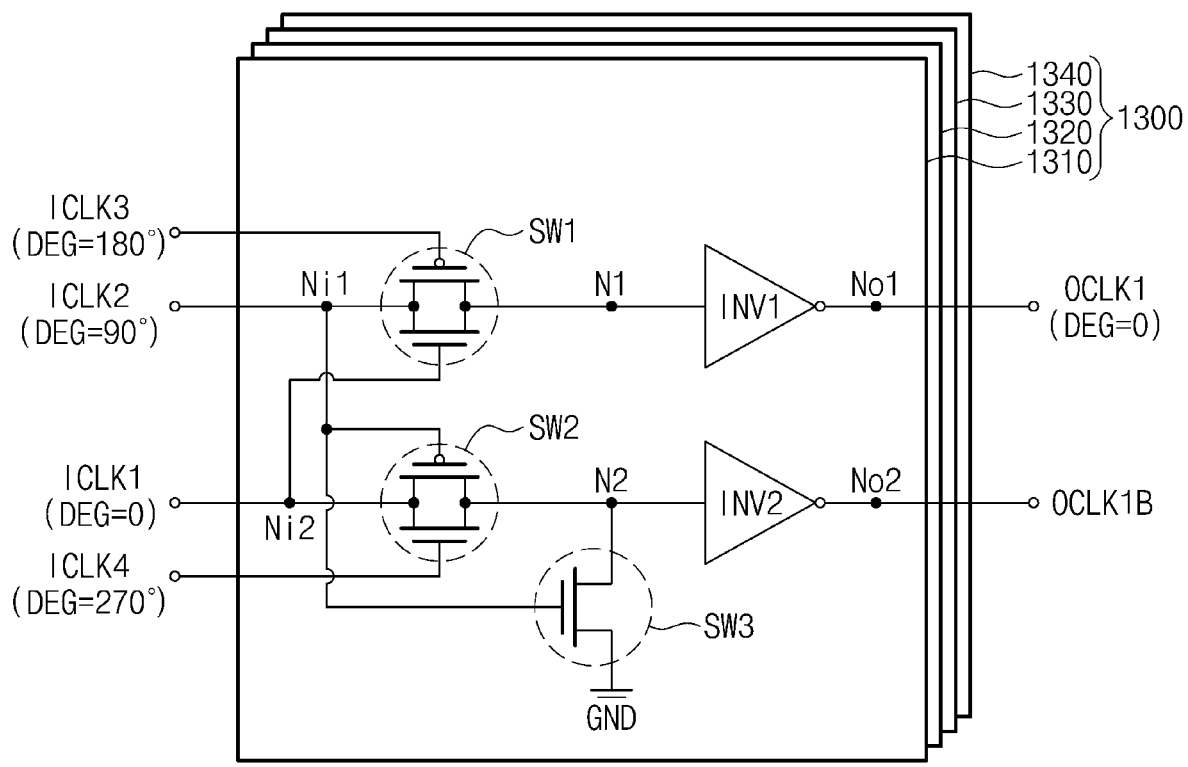
FIG. 7 is a block diagram illustrating a clock converting circuit according to an embodiment of the present disclosure in detail.

FIG. 7 is a block diagram illustrating a clock converting circuit 1300 according to an embodiment of the present disclosure in detail. Referring to FIG. 7, the clock converting circuit 1300 may include first to fourth clock circuits 1310 to 1340. Structures of the second to fourth clock circuits 1320 to 1340 may be similar to a structure of the first clock circuit 1310. For brevity of illustration, detailed structures of the second to fourth clock circuits 1320 to 1340 will be omitted.

The first clock circuit 1310 may be different from the first clock circuit 1110 of FIG. 5A in that first, second, and third switches SW1, SW2, and SW3 are implemented with transistors and the first clock circuit 1310 operates further based on the third and fourth input clocks ICLK3 and ICLK4. A phase of the third input clock ICLK3 may be delayed with respect to the phase of the first input clock ICLK1 as much as 180 degrees. A phase of the fourth input clock ICLK4 may be delayed with respect to the phase of the first input clock ICLK1 as much as 270 degrees.

The first clock circuit 1310 may include the first switch SW1, the second switch SW2, the third switch SW3, the first inverter INV1, and the second inverter INV2. The inverters INV1 and INV2 are similar to the inverters INV1 and INV2 of the first clock circuit 1110 of FIG. 5A, and thus, additional description will be omitted to avoid redundancy.

In an example embodiment, the first switch SW1 may be implemented with a transmission gate that is connected between the first input node Ni1 and the first node N1 and is configured to operate based on the first input clock ICLK1 and the third input clock ICLK3. A transmission gate may be a switch element including an NMOS transistor and a PMOS transistor connected in parallel for the purpose of controlling a connection between an input node and an output node.

For example, the first switch SW1 may include a first NMOS transistor that is connected between the first input node Ni1 and the first node N1 and is configured to operate in response to the first input clock ICLK1. The first switch SW1 may further include a first PMOS transistor that is connected between the first input node Ni1 and the first node N1 and is configured to operate in response to the third input clock ICLK3. Strength of the first switch SW1 may be reinforced by including the first NMOS transistor and the first PMOS transistor connected in parallel.

In an example embodiment, the second switch SW2 may be implemented with a transmission gate that is connected between the second input node Ni2 and the second node N2 and is configured to operate based on the second input clock ICLK2 and the fourth input clock ICLK4.

For example, the second switch SW2 may include a second NMOS transistor that is connected between the second input node Ni2 and the second node N2 and is configured to operate in response to the fourth input clock ICLK4. The second switch SW2 may further include a second PMOS transistor that is connected between the second input node Ni2 and the second node N2 and is configured to operate in response to the second input clock ICLK2. Strength of the second switch SW2 may be reinforced by including the second NMOS transistor and the second PMOS transistor connected in parallel.

In an example embodiment, the third switch SW3 may include a third NMOS transistor that is connected between the second node N2 and the ground node and is configured to operate in response to the second input clock ICLK2. The ground node may be a node to which the ground GND is provided.

As described above, according to an embodiment of the present disclosure, there may be provided the clock converting circuit 1300 including the first and second switches SW1 and SW2, the strengths of which are reinforced.

Figure 8:
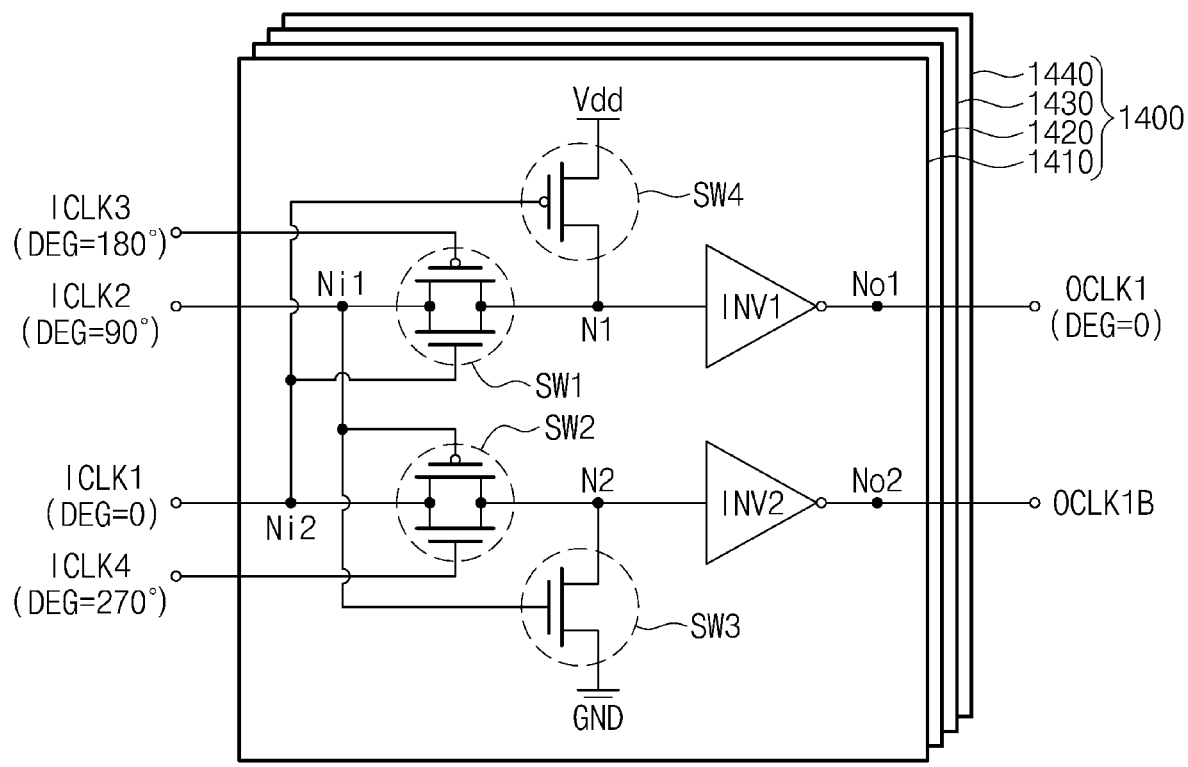
FIG. 8 is a block diagram illustrating a clock converting circuit according to an embodiment of the present disclosure in detail.

FIG. 8 is a block diagram illustrating a clock converting circuit 1400 according to an embodiment of the present disclosure in detail. Referring to FIG. 8, the clock converting circuit 1400 may include first to fourth clock circuits 1410 to 1440. Structures of the second to fourth clock circuits 1420 to 1440 may be similar to a structure of the first clock circuit 1410. For brevity of illustration, detailed structures of the second to fourth clock circuits 1420 to 1440 will be omitted.

The first clock circuit 1410 may include the first switch SW1, the second switch SW2, the third switch SW3, a fourth switch SW4, the first inverter INV1, and the second inverter INV2. The switches SW1 to SW3 and the inverters INV1 and INV2 are similar to the switches SW1 to SW3 and the inverters INV1 and INV2 of FIG. 7, and thus, additional description will be omitted to avoid redundancy.

In an example embodiment, the fourth switch SW4 may include a third PMOS transistor that is connected between the first node N1 and the power node and is configured to operate in response to the first input clock ICLK1. The power node may be a node to which the power supply voltage Vdd is provided. A voltage of the first node N1 may be stably maintained by the third PMOS transistor of the fourth switch SW4.

Figure 9:
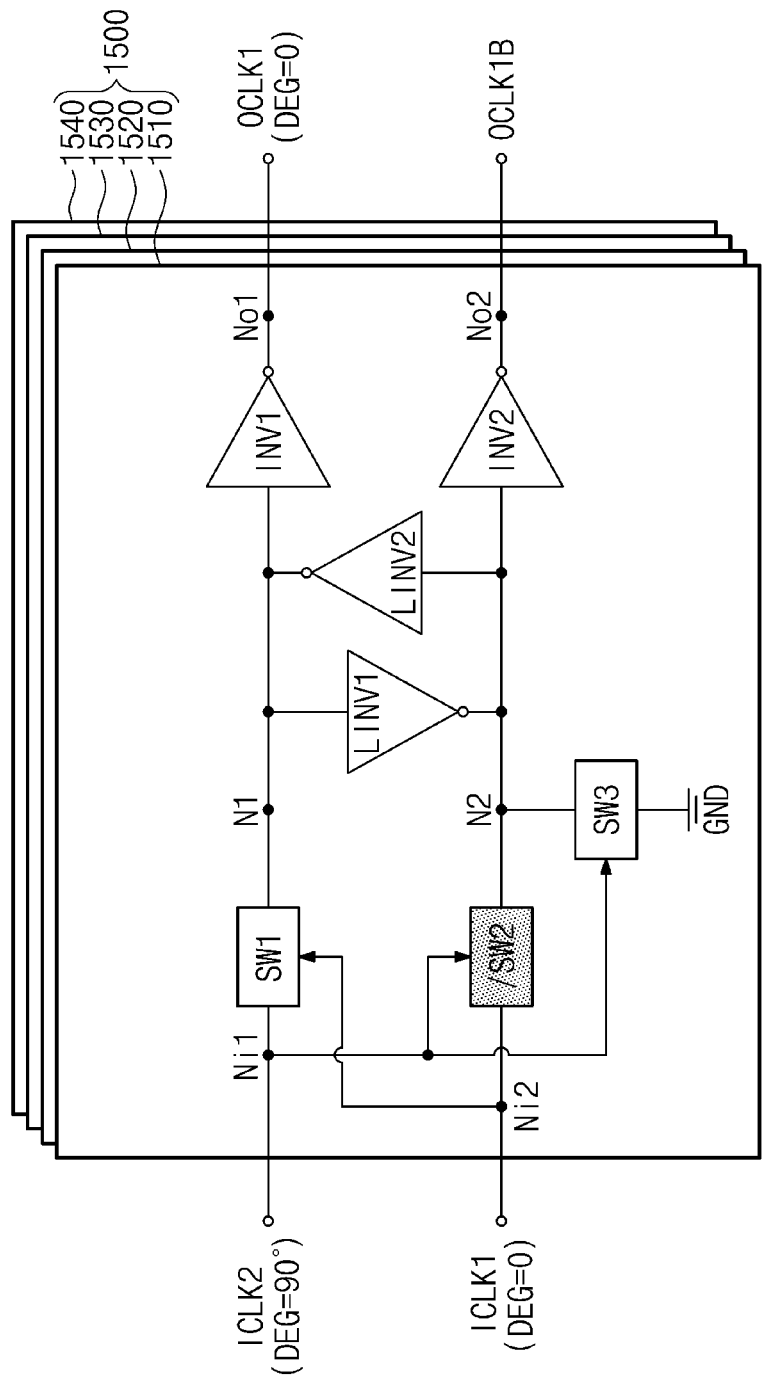
FIG. 9 is a block diagram illustrating a clock converting circuit including latch inverters according to an embodiment of the present disclosure in detail.

FIG. 9 is a block diagram illustrating a clock converting circuit 1500 including latch inverters LINV1 and LINV2 according to an embodiment of the present disclosure in detail. Referring to FIG. 9, the clock converting circuit 1500 may include first to fourth clock circuits 1510 to 1540. Structures of the second to fourth clock circuits 1520 to 1540 may be similar to a structure of the first clock circuit 1510. For brevity of illustration, detailed structures of the second to fourth clock circuits 1520 to 1540 will be omitted.

The first clock circuit 1510 may include the switches SW1, /SW2, and SW3, the inverters INV1 and INV2, and the latch inverters LINV1 and LINV2. The switches SW1, /SW2, and SW3 and the inverters INV1 and INV2 are similar to the switches SW1, /SW2, and SW3 and the inverters INV1 and INV2 of FIG. 5A, and thus, additional description will be omitted to avoid redundancy.

The first latch inverter LINV1 may be connected between the first node N1 and the second node N2. The first latch inverter LINV1 may invert a voltage of the first node N1 and may output the inverted voltage to the second node N2. A voltage of the second node N2 may be stably maintained by the first latch inverter LINV1.

The second latch inverter LINV2 may be connected between the first node N1 and the second node N2. The second latch inverter LINV2 may invert a voltage of the second node N2 and may output the inverted voltage to the first node N1. A voltage of the first node N1 may be stably maintained by the second latch inverter LINV2.

Figure 10:
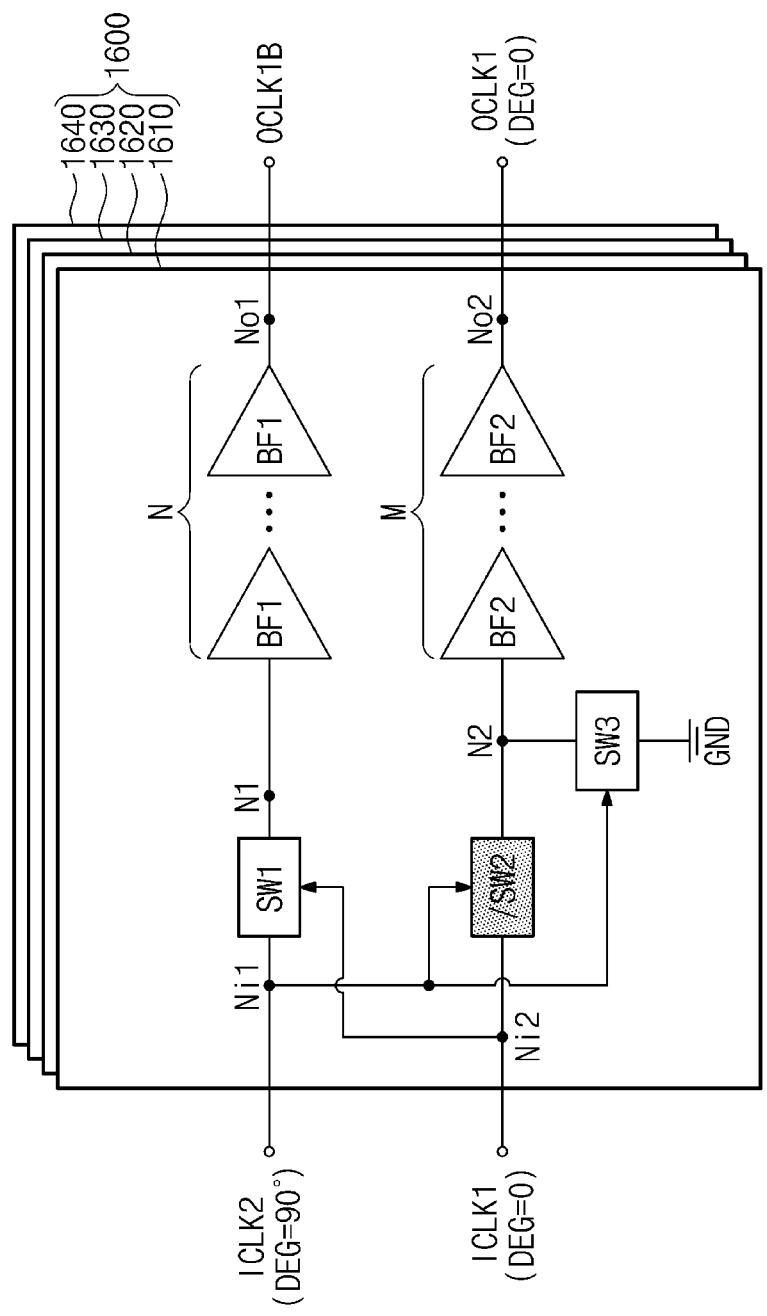
FIG. 10 is a block diagram illustrating a clock converting circuit including buffers according to an embodiment of the present disclosure in detail.

FIG. 10 is a block diagram illustrating a clock converting circuit 1600 including buffers BF1 and BF2 according to an embodiment of the present disclosure in detail. Referring to FIG. 10, the clock converting circuit 1600 may include first to fourth clock circuits 1610 to 1640. Structures of the second to fourth clock circuits 1620 to 1640 may be similar to a structure of the first clock circuit 1610. For brevity of illustration, detailed structures of the second to fourth clock circuits 1620 to 1640 will be omitted.

The first clock circuit 1610 may include the switches SW1, /SW2, and SW3, N first buffers BF1, and M second buffers BF2. Here, "N" and "M" is a natural number. The switches SW1, /SW2, and SW3 are similar to the switches SW1, /SW2, and SW3 of FIG. 5A, and thus, additional description will be omitted to avoid redundancy.

The first clock circuit 1610 may include the N first buffers BF1 between the first node N1 and the first output node No1. The first buffer BF1 may be a module or a circuit that transfers a voltage of an input terminal to an output terminal. Unlike the first inverter INV1 of FIG. 9, the first buffer BF1 may be a module or a circuit that transfers a voltage with a logic state maintained (e.g., without inversion).

The first clock circuit 1610 may include the M second buffers BF2 between the second node N2 and the second output node No2. The second buffer BF2 may be a module or a circuit that transfers a voltage of an input terminal to an output terminal with a logic state maintained.

In an example embodiment, unlike the first clock circuit 1110 of FIG. 5A, the first clock circuit 1610 may generate the first inverted output clock OCLK1B at the first output node No1 and may generate the first output clock OCLK1 at the second output node No2. For example, as the N first buffers BF1 transfer a voltage of the first node N1 without inversion, the first inverted output clock OCLK1B may be generated at the first output node No1. Also, as the M second buffers BF2 transfer a voltage of the second node N2 without inversion, the first output clock OCLK1 may be generated at the second output node No2.

In an example embodiment, a buffer may be implemented with two inverters connected in series. For example, one of the N first buffers BF1 may be implemented with two first inverters INV1 connected in series. One of the M second buffers BF2 may be implemented with two second inverters INV2 connected in series.

In an example embodiment, "N" and "M" may be equal. As the number of first buffers BF1 connected between the first node N1 and the first output node No1 is equal to the number of second buffers BF2 connected between the second node N2 and the second output node No2, a skew between the first output clock OCLK1 and the first inverted output clock OCLK1B may be suppressed.

In an example embodiment, even though "N" and "M" are different, a first time interval where the N first buffers BF1 transfer a voltage of the first node N1 to the first output node No1 may be equal to a second time interval where the M second buffers BF2 transfer a voltage of the second node N2 to the second output node No2. For example, the present disclosure is not limited to the case where "N" and "M" are equal and includes the case where a delay time of the first output clock OCLK1 by a corresponding output stage (e.g., an inverter and/or a buffer) is equal to a delay time of the first inverted output clock OCLK1B by a corresponding output stage (e.g., an inverter and/or a buffer).

In an example embodiment, unlike the example illustrated in FIG. 10, the first clock circuit 1610 may include N first inverters INV1, which are connected in series between the first node N1 and the first output node No1, instead of the N first buffers BF1 connected in series therebetween. Also, the first clock circuit 1610 may include M second inverters INV2, which are connected in series between the second node N2 and the second output node No2, instead of the M second buffers BF2 connected in series therebetween.

In this case, a first time interval corresponding to a delay of the N first inverters INV1 may be equal to a second time interval corresponding to a delay of the M second inverters INV2. For example, when "N" and "M" are equal and "N" is odd-numbered, the first output clock OCLK1 may be generated at the first output node No1, and the first inverted output clock OCLK1B may be generated at the second output node No2. For example, when "N" and "M" are equal and "N" is even-numbered, the first inverted output clock OCLK1B may be generated at the first output node No1, and the first output clock OCLK1 may be generated at the second output node No2.

Figure 11:
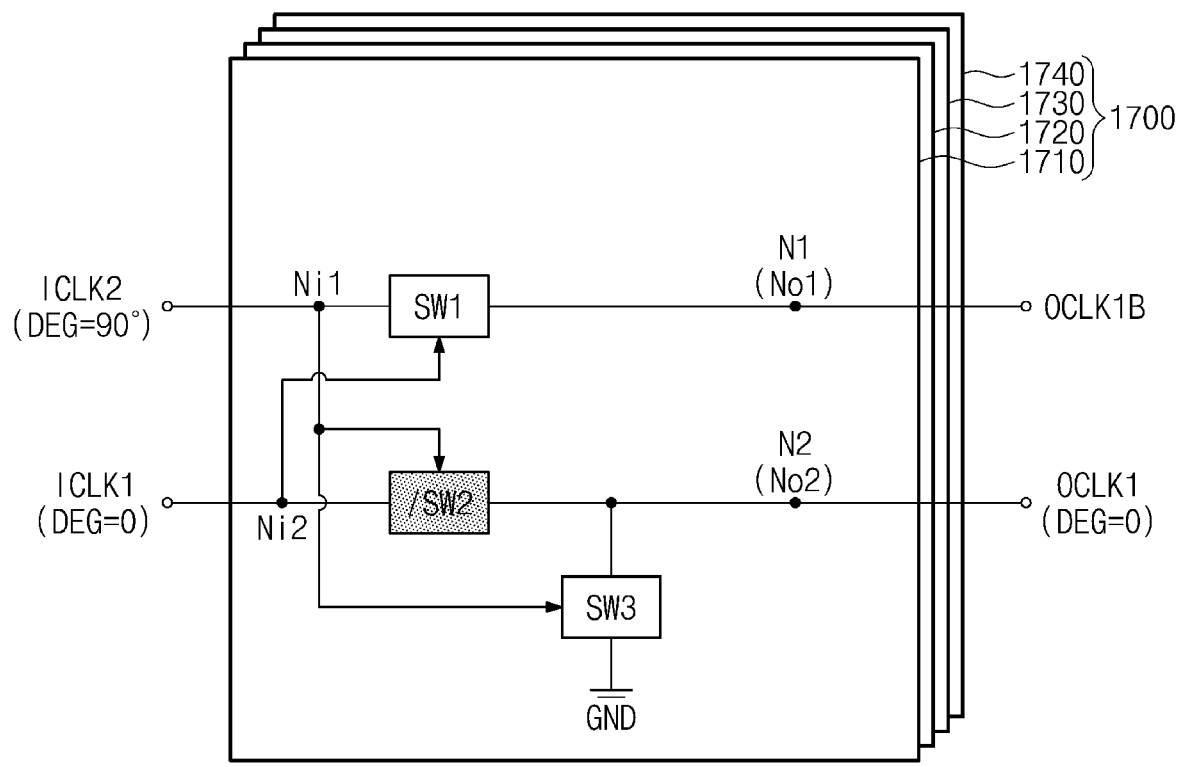
FIG. 11 is a block diagram illustrating a simplified clock converting circuit according to an embodiment of the present disclosure in detail.

FIG. 11 is a block diagram illustrating a clock converting circuit 1700 according to an embodiment of the present disclosure in detail. Referring to FIG. 11, the clock converting circuit 1700 may include first to fourth clock circuits 1710 to 1740. Structures of the second to fourth clock circuits 1720 to 1740 may be similar to a structure of the first clock circuit 1710. For brevity of illustration, detailed structures of the second to fourth clock circuits 1720 to 1740 will be omitted.

The first clock circuit 1710 may include switches SW1, /SW2, and SW3. The switches SW1, /SW2, and SW3 are similar to the switches SW1, /SW2, and SW3 of FIG. 5A, and thus, additional description will be omitted to avoid redundancy. Unlike the first clock circuit 1110 of FIG. 5A, the first clock circuit 1710 may not include the first inverter INV1 and the second inverter INV2. For example, in the first clock circuit 1710, the first node N1 may be short-circuited to the first output node No1, and the second node N2 may be short-circuited to the second output node No2.

As the first inverter INV1 and the second inverter INV2 are omitted, the area of a semiconductor chip including the first clock circuit 1710 may be reduced. Also, power consumption of the first clock circuit 1710 may be reduced.

Figure 12A:
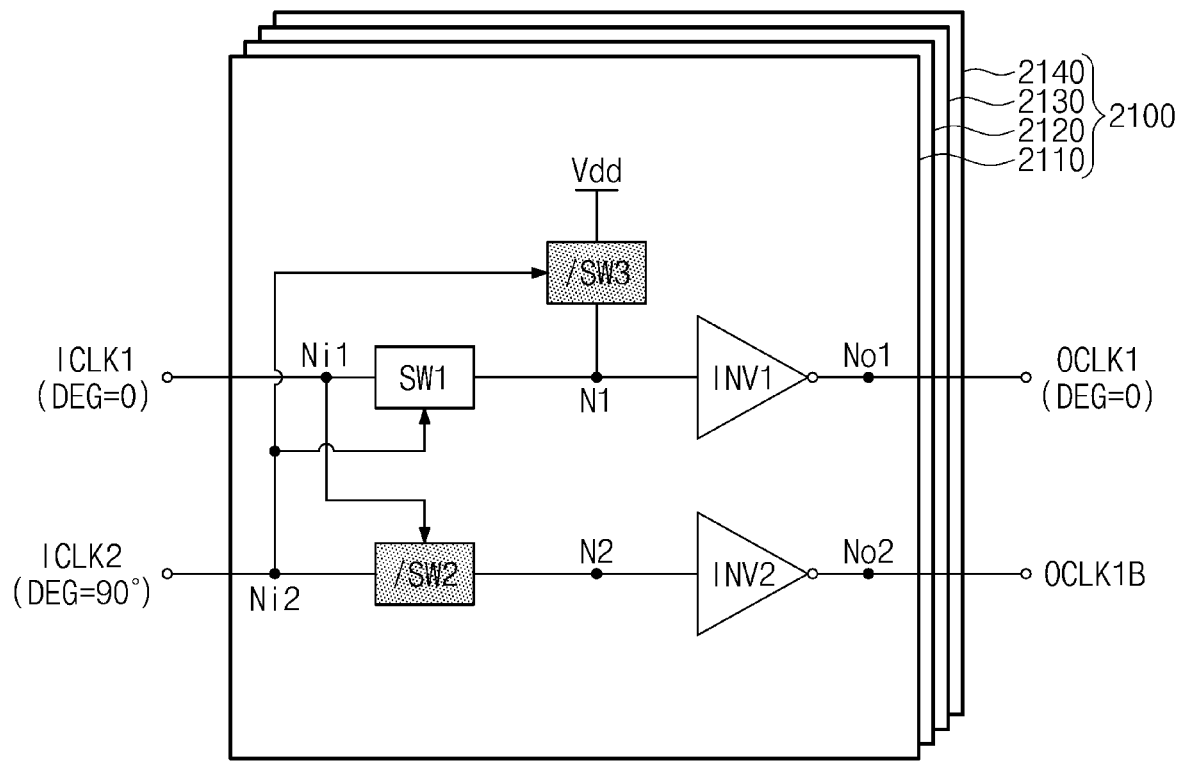
FIG. 12A is a block diagram illustrating a clock converting circuit according to an embodiment of the present disclosure in detail.

FIG. 12A is a block diagram illustrating a clock converting circuit 2100 according to an embodiment of the present disclosure in detail. Unlike the clock converting circuit 1100 (refer to FIG. 5A) which operates based on the rising edge, the clock converting circuit 2100 may operate based on the falling edge. Referring to FIG. 12A, the clock converting circuit 2100 may include first to fourth clock circuits 2110 to 2140. The first clock circuit 2110 may generate the first output clock OCLK1 and the first inverted output clock OCLK1B based on the first input clock ICLK1 and the second input clock ICLK2. Structures of the second to fourth clock circuits 2120 to 2140 will be more fully described with reference to FIG. 12C.

The first clock circuit 2110 may include the first switch SW1, the second switch /SW2, a third switch /SW3, the first inverter INV1, and the second inverter INV2. The first inverter INV1 and the second inverter INV2 are similar to the first inverter INV1 and the second inverter INV2 of FIG. 5A, and thus, additional description will be omitted to avoid redundancy.

The first clock circuit 2110 may receive the first input clock ICLK1 through the first input node Ni1. The first clock circuit 2110 may receive the second input clock ICLK2 through the second input node Ni2. The first clock circuit 2110 may output the first output clock OCLK1 through the first output node No1. The first clock circuit 2110 may output the first inverted output clock OCLK1B through the second output node No2.

The first switch SW1 may be connected between the first input node Ni1 and the first node N1. The first switch SW1 may operate in response to the first logic state of the second input clock ICLK2 on the second input node Ni2.

For example, the first switch SW1 may be turned on in a time interval where the second input clock ICLK2 has the first logic state (e.g., the logical high level) and may be turned off in a time interval where the second input clock ICLK2 has the second logic state (e.g., the logical low level), but the present disclosure is not limited thereto.

The second switch /SW2 may be connected between the second input node Ni2 and the second node N2. The second switch /SW2 may operate in response to the second logic state of the first input clock ICLK1 on the first input node Ni1.

For example, the second switch /SW2 may be turned on in a time interval where the first input clock ICLK1 has the second logic state (e.g., the logical low level) and may be turned off in a time interval where the first input clock ICLK1 has the first logic state (e.g., the logical high level), but the present disclosure is not limited thereto.

The third switch /SW3 may be connected between the first node N1 and the power node. The power node may be a node to which the power supply voltage Vdd is provided. The third switch /SW3 may operate in response to the second logic state of the second input clock ICLK2.

For example, the third switch /SW3 may be turned on in a time interval where the second input clock ICLK2 has the second logic state (e.g., the logical low level) and may be turned off in a time interval where the second input clock ICLK2 has the first logic state (e.g., the logical high level), but the present disclosure is not limited thereto.

As described above, according to an embodiment of the present disclosure, unlike the clock converting circuit 1100 of FIG. 5A operating based on the rising edges of the same type, the clock converting circuit 2100 that generates the first output clock OCLK1 and the first inverted output clock OCLK1B based on the falling edges of the same type is provided. A process in which the first clock circuit 2110 of the clock converting circuit 2100 generates the first output clock OCLK1 and the first inverted output clock OCLK1B will be described with reference to FIG. 12B.

Figure 12B:
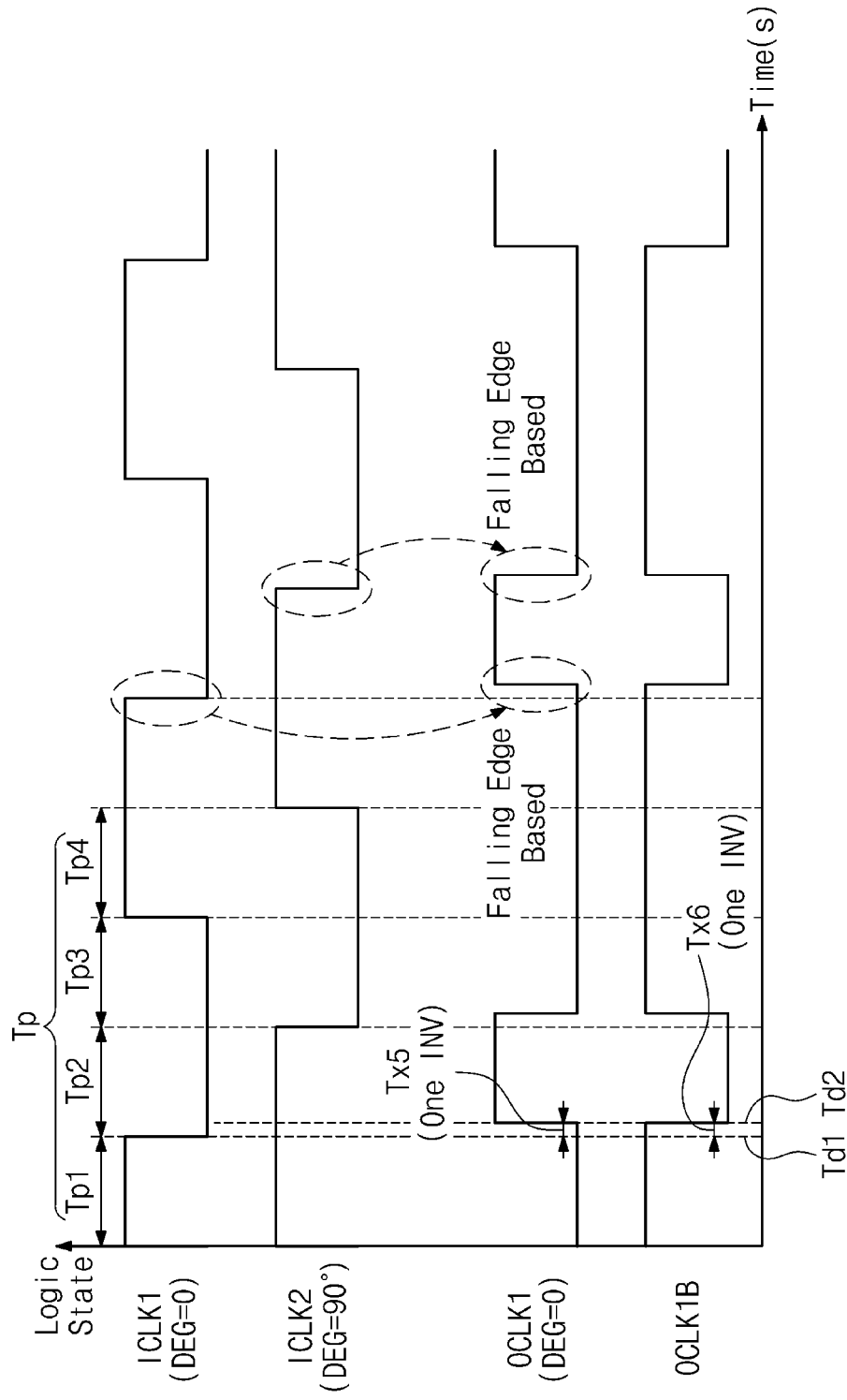
FIG. 12B is a graph illustrating input clocks and output clocks of a clock converting circuit of FIG. 12A according to example embodiments.

FIG. 12B is a graph illustrating input clocks and output clocks of a clock converting circuit of FIG. 12A. A waveform of the first input clock ICLK1, a waveform of the second input clock ICLK2, a waveform of the first output clock OCLK1, and a waveform of the first inverted output clock OCLK1B are illustrated in FIG. 12B. In the graph of FIG. 12B, a transverse direction represents a time, and a longitudinal direction represents a logic state.

The first input clock ICLK1 may have the period Tp. The period Tp may include the first to fourth time intervals Tp1 to Tp4. A phase of the second input clock ICLK2 may be delayed with respect to a phase of the first input clock ICLK1 as much as 90 degrees. The first and second input clocks ICLK1 and ICLK2 may be similar to the first and second input clocks ICLK1 and ICLK2 of FIG. 5B except that time intervals of the graphs of FIGS. 5B and 12B are different.

In an example embodiment, a voltage waveform at the first node N1 may be similar to a voltage waveform of the first inverted output clock OCLK1B. The voltage waveform at the first node N1 may be based on the falling edge of the first input clock ICLK1 and the falling edge of the second input clock ICLK2.

For example, in the first time interval Tp1, the first switch SW1 may be turned on, the first input clock ICLK1 may have the first logic state, and the third switch /SW3 may be turned off. In this case, the first node N1 may have a voltage corresponding to the first logic state. In the second time interval Tp2, the first switch SW1 may be turned on, the first input clock ICLK1 may have the second logic state, and the third switch /SW3 may be turned off. In this case, the first node N1 may have a voltage corresponding to the second logic state. In the third and fourth time intervals Tp3 and Tp4, because the power supply voltage Vdd is provided to the first node N1 through the third switch /SW3 turned on by the second input clock ICLK2 having the second logic state, the first node N1 may have a voltage corresponding to the first logic state.

In an example embodiment, the first inverter INV1 may generate the first output clock OCLK1 based on the voltage of the first node N1. Due to the first inverter INV1, the first output clock OCLK1 may be delayed with respect to the first input clock ICLK1 as much as a time interval Tx5. The time interval Tx5 may be an interval from the time Td1 to the time Td2.

In an example embodiment, a voltage waveform at the second node N2 may be similar to a voltage waveform of the first output clock OCLK1. The voltage waveform at the second node N2 may be based on the falling edge of the first input clock ICLK1 and the falling edge of the second input clock ICLK2.

For example, because the second switch /SW2 is turned off in the first time interval Tp1, the second node N2 may maintain a voltage formed before the first time interval Tp1. Because the first input clock ICLK1 is a periodic signal, the voltage of the second node N2 before the first time interval Tp1 may be similar to a voltage (e.g., a voltage corresponding to the second logic state) of the second node N2 in the fourth time interval Tp4. In the second time interval Tp2, the second switch /SW2 may be turned on, and the second input clock ICLK2 may have the first logic state. In this case, the second node N2 may have a voltage corresponding to the first logic state. In the third time interval Tp3, the second switch /SW2 may be turned on, and the second input clock ICLK2 may have the second logic state. In this case, the second node N2 may have a voltage corresponding to the second logic state. Because the second switch /SW2 is turned off in the fourth time interval Tp4, the second node N2 may maintain a voltage corresponding to the second logic state.

In an example embodiment, the second inverter INV2 may generate the first inverted output clock OCLK1B based on the voltage of the second node N2. Due to the second inverter INV2, the first inverted output clock OCLK1B may be delayed with respect to the first input clock ICLK1 as much as a time interval Tx6. The time interval Tx6 may be an interval from the time Td1 to the time Td2.

Like the first clock circuit 110b of FIG. 5A, the first clock circuit 2110 may be configured in such a way that the number of inverters for the first output clock OCLK1 is equal to the number of inverters for the first inverted output clock OCLK1B, and thus, the time interval Tx6 may be equal to the time interval Tx5. That is, as the first clock circuit 2110 has a symmetric structure, a skew between the first output clock OCLK1 and the first inverted output clock OCLK1B may be suppressed at the first clock circuit 2110.

As described above, according to an embodiment of the present disclosure, there is provided the first clock circuit 2110 that generates an output clock based on edges of the same type and has a symmetric structure. However, this characteristic is also applied to the second to fourth clock circuits 2120 to 2140 of the clock converting circuit 2100, not limited to the first clock circuit 2110. Characteristics of the second to fourth clock circuits 2120 to 2140 will be more fully described with reference to FIG. 12C.

Figure 12C:
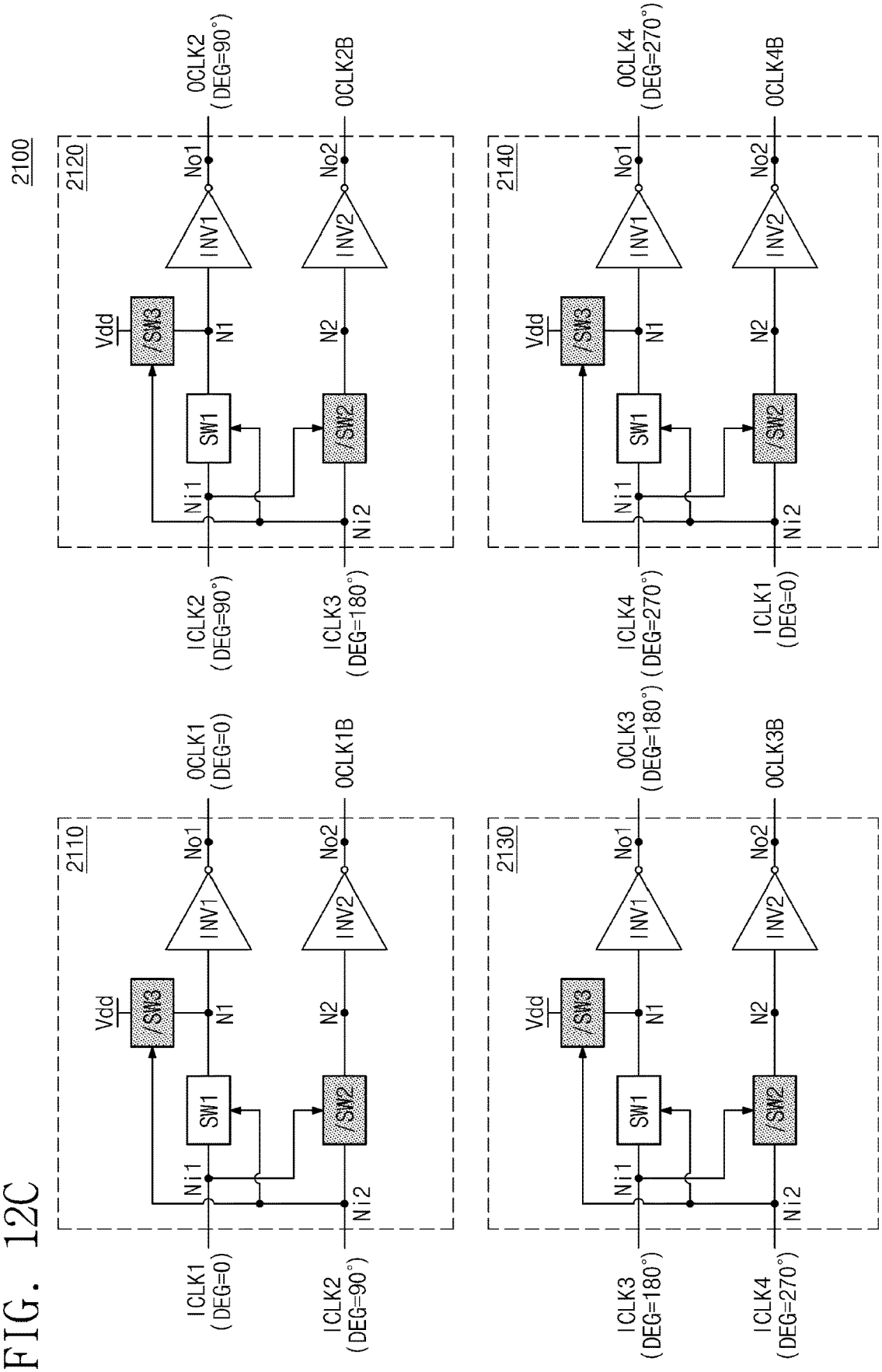
FIG. 12C is a block diagram illustrating first to fourth clock circuits of FIG. 12A according to example embodiments in detail.

FIG. 12C is a block diagram illustrating the first to fourth clock circuits 2110 to 2140 of FIG. 12A in detail. The clock converting circuit 2100 including the first to fourth clock circuits 2110 to 2140 is illustrated in FIG. 12C. The switches SW1, /SW2, and /SW3 and the inverters INV1 and INV2 of the first clock circuit 2110 are similar to the switches SW1, /SW2, and /SW3 and the inverters INV1 and INV2 of the first clock circuit 2110 of FIG. 12A, and thus, additional description will be omitted to avoid redundancy.

Referring to FIG. 12C, the switches SW1, /SW2, and /SW3 and the inverters INV1 and INV2 of each of the second to fourth clock circuits 2120 to 2140 may be similar to the switches SW1, /SW2, and /SW3 and the inverters INV1 and INV2 of the first clock circuit 2110. However, the second to fourth clock circuits 2120 to 2140 may be different from the first clock circuit 2110 in terms of input clocks provided to the input nodes Ni1 and Ni2 and output clocks generated at the output nodes No1 and No2.

The second clock circuit 2120 may receive the second input clock ICLK2 through the first input node Ni1. The second clock circuit 2120 may receive the third input clock ICLK3 through the second input node Ni2. The second clock circuit 2120 may generate the second output clock OCLK2 and the second inverted output clock OCLK2B based on the second and third input clocks ICLK2 and ICLK3. The second clock circuit 2120 may output the second output clock OCLK2 through the first output node No1. The second clock circuit 2120 may output the second inverted output clock OCLK2B through the second output node No2.

The third clock circuit 2130 may receive the third input clock ICLK3 through the first input node Ni1. The third clock circuit 2130 may receive the fourth input clock ICLK4 through the second input node Ni2. The third clock circuit 2130 may generate the third output clock OCLK3 and the third inverted output clock OCLK3B based on the third and fourth input clocks ICLK3 and ICLK4. The third clock circuit 2130 may output the third output clock OCLK3 through the first output node No1. The third clock circuit 2130 may output the third inverted output clock OCLK3B through the second output node No2.

The fourth clock circuit 2140 may receive the fourth input clock ICLK4 through the first input node Ni1. The fourth clock circuit 2140 may receive the first input clock ICLK1 through the second input node Ni2. The fourth clock circuit 2140 may generate the fourth output clock OCLK4 and the fourth inverted output clock OCLK4B based on the fourth and first input clocks ICLK4 and ICLK1. The fourth clock circuit 2140 may output the fourth output clock OCLK4 through the first output node No1. The fourth clock circuit 2140 may output the fourth inverted output clock OCLK4B through the second output node No2.

In an example embodiment, in the clock converting circuit 2100, nodes for receiving the same input clock may be implemented with one node. For example, the second input node Ni2 of the first clock circuit 2110 may be the first input node Ni1 of the second clock circuit 2120. The second input node Ni2 of the second clock circuit 2120 may be the first input node Ni1 of the third clock circuit 2130. The second input node Ni2 of the third clock circuit 2130 may be the first input node Ni1 of the fourth clock circuit 2140. The second input node Ni2 of the fourth clock circuit 2140 may be the first input node Ni1 of the first clock circuit 2110.

As described above, according to an embodiment of the present disclosure, there is provided the clock converting circuit 2100 that generates an output clock based on edges of the same type and includes the first to fourth clock circuits 2110 to 2140 each having a symmetric structure. Unlike the clock converting circuit 1100 (refer to FIG. 5C) which operates based on the rising edge, the clock converting circuit 2100 may operate based on the falling edge.

Figure 13:
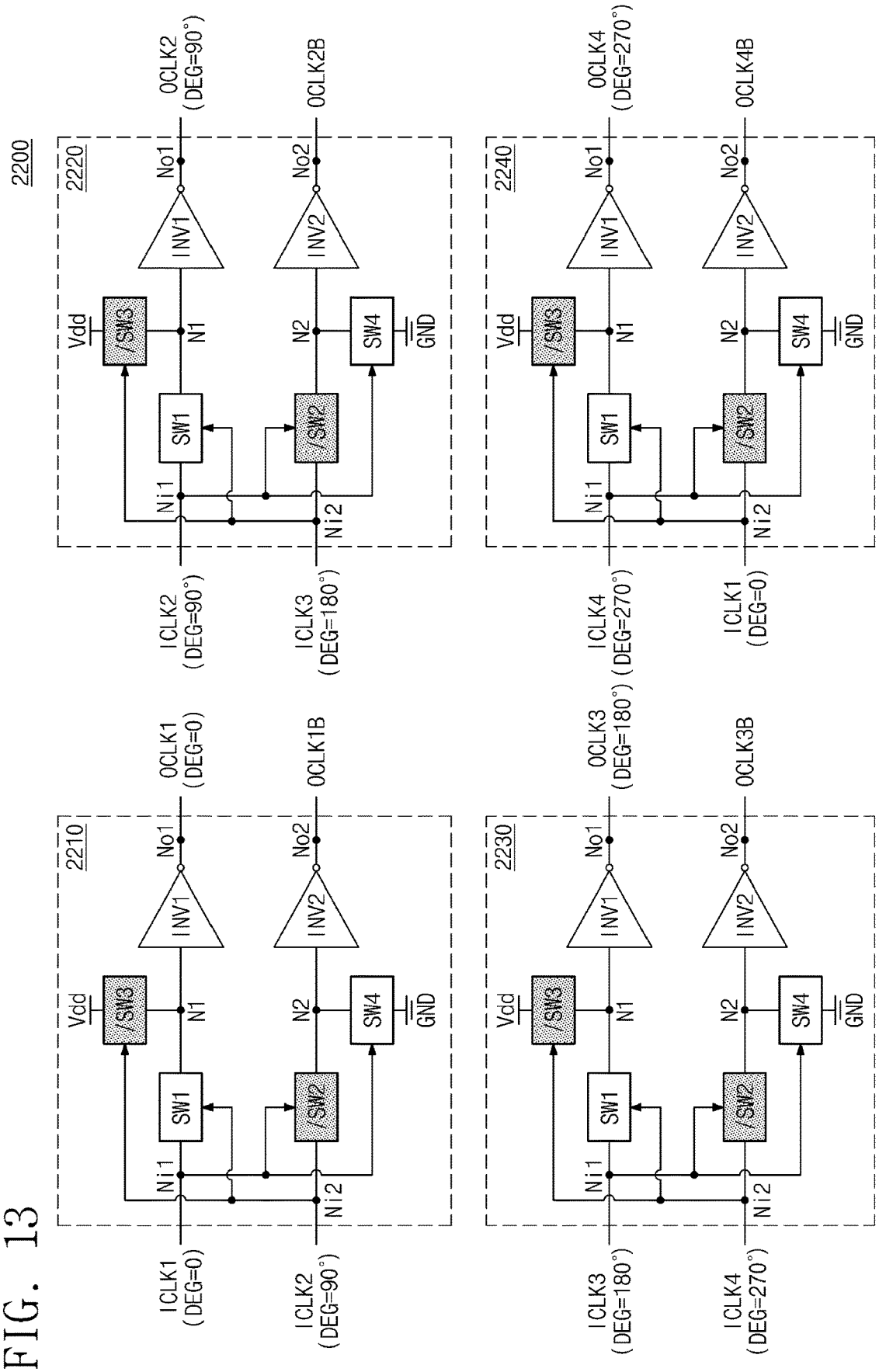
FIG. 13 is a block diagram illustrating a clock converting circuit according to an embodiment of the present disclosure in detail.

FIG. 13 is a block diagram illustrating a clock converting circuit 2200 according to an embodiment of the present disclosure in detail. Referring to FIG. 13, the clock converting circuit 2200 may include first to fourth clock circuits 2210 to 2240. Each of the first to fourth clock circuits 2210 to 2240 may include switches SW1, /SW2, /SW3, and SW4 and the inverters INV1 and INV2.

Referring to FIG. 13, the switches SW1, /SW2, and /SW3 and the inverters INV1 and INV2 of each of the first to fourth clock circuits 2210 to 2240 are similar to the switches SW1, /SW2, and /SW3 and the inverters INV1 and INV2 of each of the first to fourth clock circuits 2110 to 2140 of FIG. 12C, and thus, additional description will be omitted to avoid redundancy.

Unlike the first to fourth clock circuits 2110 to 2140 of FIG. 12C, each of the first to fourth clock circuits 2210 to 2240 may further include the fourth switch SW4 connected between the second node N2 and the ground node. The ground node may be a node to which the ground GND is provided. The fourth switch SW4 may be used to maintain a voltage of the second node N2 stably. The fourth switch SW4 may operate in response to the first logic state of an input clock applied to the first input node Ni1.

In an example embodiment, the fourth switch SW4 of the first clock circuit 2210 may be connected between the second node N2 and the ground node and may operate in response to the first logic state of the first input clock ICLK1 on the first input node Ni1.

For example, the fourth switch SW4 may be turned on in a time interval where the first input clock ICLK1 has the first logic state (e.g., the logical high level) and may be turned off in a time interval where the first input clock ICLK1 has the second logic state (e.g., the logical low level), but the present disclosure is not limited thereto.

As described above, according to an embodiment of the present disclosure, in a time interval where the first input clock ICLK1 has the first logic state, the fourth switch SW4 may provide the ground GND to the second node N2, and thus, a voltage of the second node N2 may be stably maintained in a specific time interval (e.g., Tp1 and Tp4 of FIG. 12B).

Figure 14:
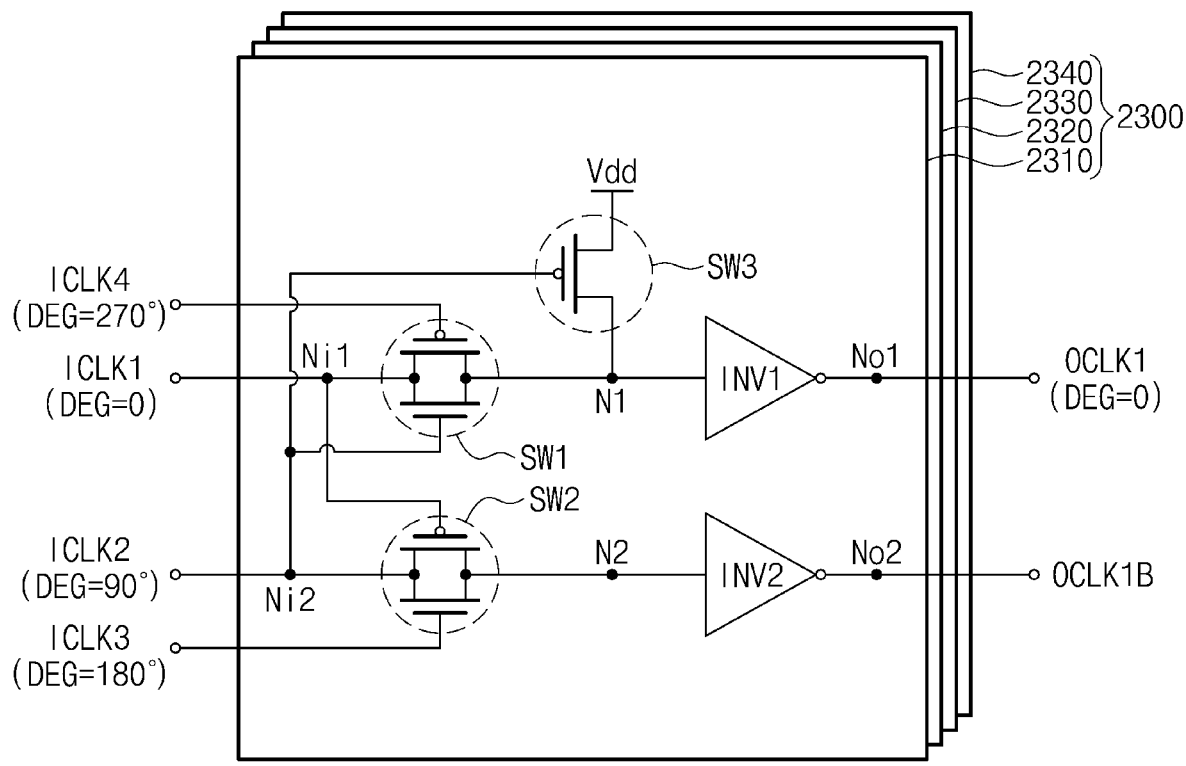
FIG. 14 is a block diagram illustrating a clock converting circuit according to an embodiment of the present disclosure in detail.

FIG. 14 is a block diagram illustrating a clock converting circuit 2300 according to an embodiment of the present disclosure in detail. Referring to FIG. 14, the clock converting circuit 2300 may include first to fourth clock circuits 2310 to 2340. Structures of the second to fourth clock circuits 2320 to 2340 may be similar to a structure of the first clock circuit 2310. For brevity of illustration, detailed structures of the second to fourth clock circuits 2320 to 2340 will be omitted.

The first clock circuit 2310 may be different from the first clock circuit 2110 of FIG. 12A in that the first, second, and third switches SW1, SW2, and SW3 are implemented with transistors and the first clock circuit 2310 operates further based on the third and fourth input clocks ICLK3 and ICLK4.

The first clock circuit 2310 may include the first switch SW1, the second switch SW2, the third switch SW3, the first inverter INV1, and the second inverter INV2. The inverters INV1 and INV2 are similar to the inverters INV1 and INV2 of the first clock circuit 2110 of FIG. 12A, and thus, additional description will be omitted to avoid redundancy.

In an example embodiment, the first switch SW1 may be implemented with a transmission gate that is connected between the first input node Ni1 and the first node N1 and is configured to operate based on the second input clock ICLK2 and the fourth input clock ICLK4.

For example, the first switch SW1 may include a first NMOS transistor that is connected between the first input node Ni1 and the first node N1 and is configured to operate in response to the second input clock ICLK2. The first switch SW1 may further include a first PMOS transistor that is connected between the first input node Ni1 and the first node N1 and is configured to operate in response to the fourth input clock ICLK4. Strength of the first switch SW1 may be reinforced by including the first NMOS transistor and the first PMOS transistor connected in parallel.

In an example embodiment, the second switch SW2 may be implemented with a transmission gate that is connected between the second input node Ni2 and the second node N2 and is configured to operate based on the first input clock ICLK1 and the third input clock ICLK3.

For example, the second switch SW2 may include a second NMOS transistor that is connected between the second input node Ni2 and the second node N2 and is configured to operate in response to the third input clock ICLK3. The second switch SW2 may further include a second PMOS transistor that is connected between the second input node Ni2 and the second node N2 and is configured to operate in response to the first input clock ICLK1. Strength of the second switch SW2 may be reinforced by including the second NMOS transistor and the second PMOS transistor connected in parallel.

In an example embodiment, the third switch SW3 may include a third PMOS transistor that is connected between the first node N1 and the power node and is configured to operate in response to the second input clock ICLK2. The power node may be a node to which the power supply voltage Vdd is provided.

As described above, according to an embodiment of the present disclosure, there may be provided the clock converting circuit 2300 including the first and second switches SW1 and SW2, the strengths of which are reinforced.

Figure 15:
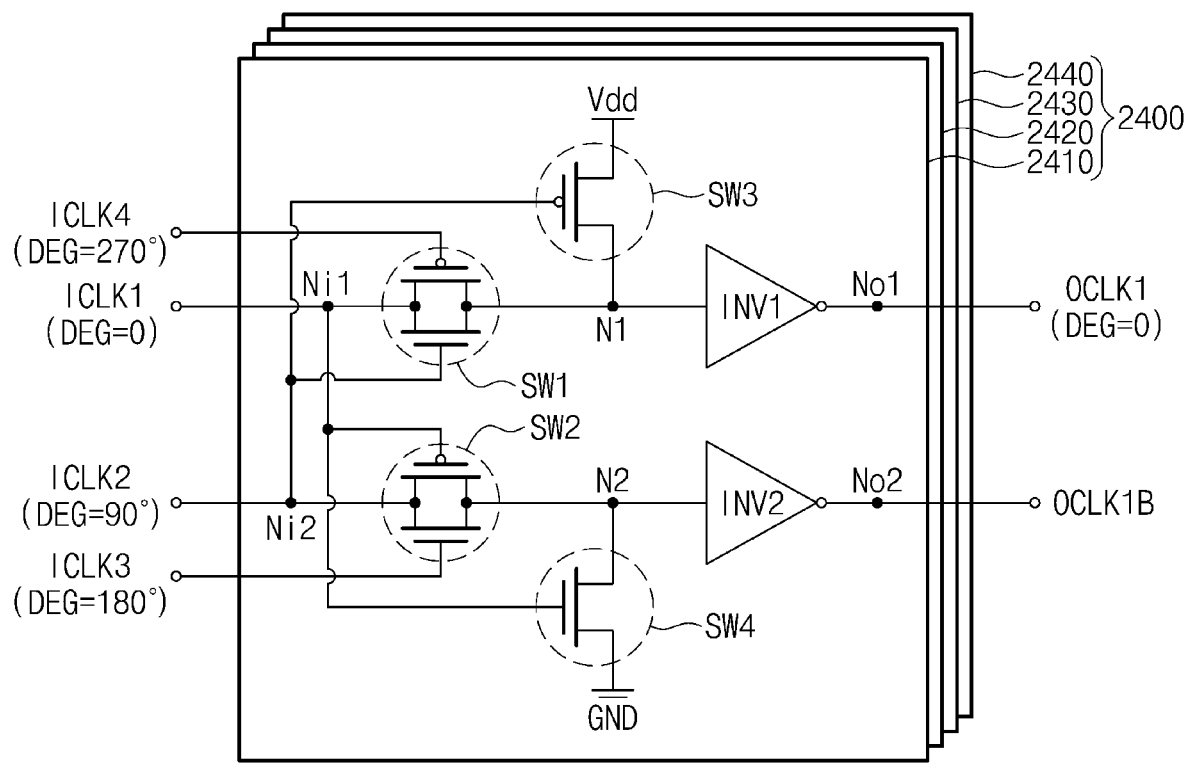
FIG. 15 is a block diagram illustrating a clock converting circuit according to an embodiment of the present disclosure in detail.

FIG. 15 is a block diagram illustrating a clock converting circuit 2400 according to an embodiment of the present disclosure in detail. Referring to FIG. 15, the clock converting circuit 2400 may include first to fourth clock circuits 2410 to 2440. Structures of the second to fourth clock circuits 2420 to 2440 may be similar to a structure of the first clock circuit 2410. For brevity of illustration, detailed structures of the second to fourth clock circuits 2420 to 2440 will be omitted.

The first clock circuit 2410 may include the first switch SW1, the second switch SW2, the third switch SW3, the fourth switch SW4, the first inverter INV1, and the second inverter INV2. The switches SW1 to SW3 and the inverters INV1 and INV2 are similar to the switches SW1 to SW3 and the inverters INV1 and INV2 of FIG. 14, and thus, additional description will be omitted to avoid redundancy.

In an example embodiment, the fourth switch SW4 may include a third NMOS transistor that is connected between the second node N2 and the ground node and is configured to operate in response to the first input clock ICLK1. The ground node may be a node to which the ground GND is provided. A voltage of the second node N2 may be stably maintained by the third NMOS transistor of the fourth switch SW4.

Figure 16:
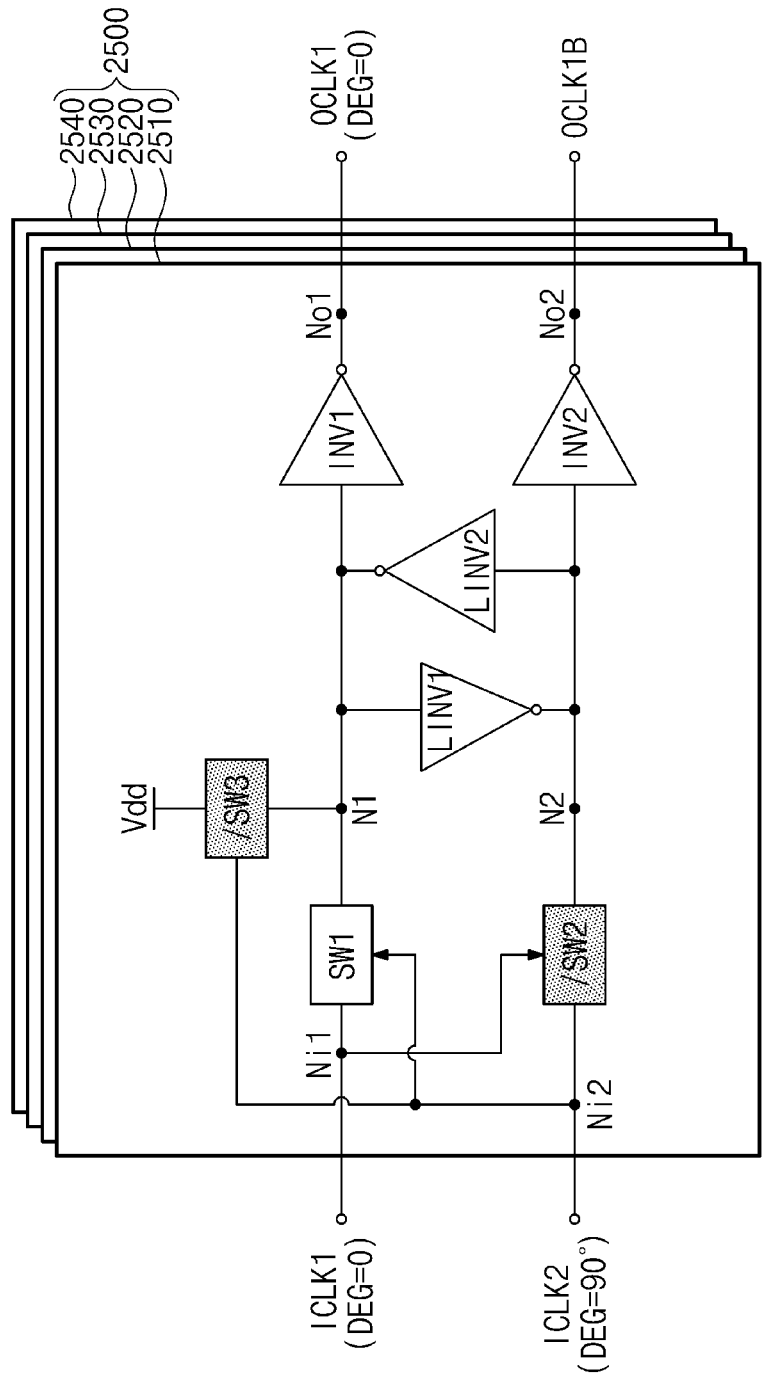
FIG. 16 is a block diagram illustrating a clock converting circuit including latch inverters according to an embodiment of the present disclosure in detail.

FIG. 16 is a block diagram illustrating a clock converting circuit 2500 including the latch inverters LINV1 and LINV2 according to an embodiment of the present disclosure in detail. Referring to FIG. 16, the clock converting circuit 2500 may include first to fourth clock circuits 2510 to 2540. Structures of the second to fourth clock circuits 2520 to 2540 may be similar to a structure of the first clock circuit 2510. For brevity of illustration, detailed structures of the second to fourth clock circuits 2520 to 2540 will be omitted.

The first clock circuit 2510 may include the switches SW1, /SW2, and /SW3, the inverters INV1 and INV2, and the latch inverters LINV1 and LINV2. The switches SW1, /SW2, and /SW3 and the inverters INV1 and INV2 are similar to the switches SW1, /SW2, and /SW3 and the inverters INV1 and INV2 of FIG. 12A, and thus, additional description will be omitted to avoid redundancy. The latch inverters LINV1 and LINV2 are similar to the latch inverters LINV1 and LINV2 of FIG. 9, and thus, additional description will be omitted to avoid redundancy.

According to an embodiment of the present disclosure, there may be provided the clock converting circuit 2500 in which a voltage of the second node N2 is stably maintained by the first latch inverter LINV1 and a voltage of the first node N1 is stably maintained by the second latch inverter LINV2.

Figure 17:
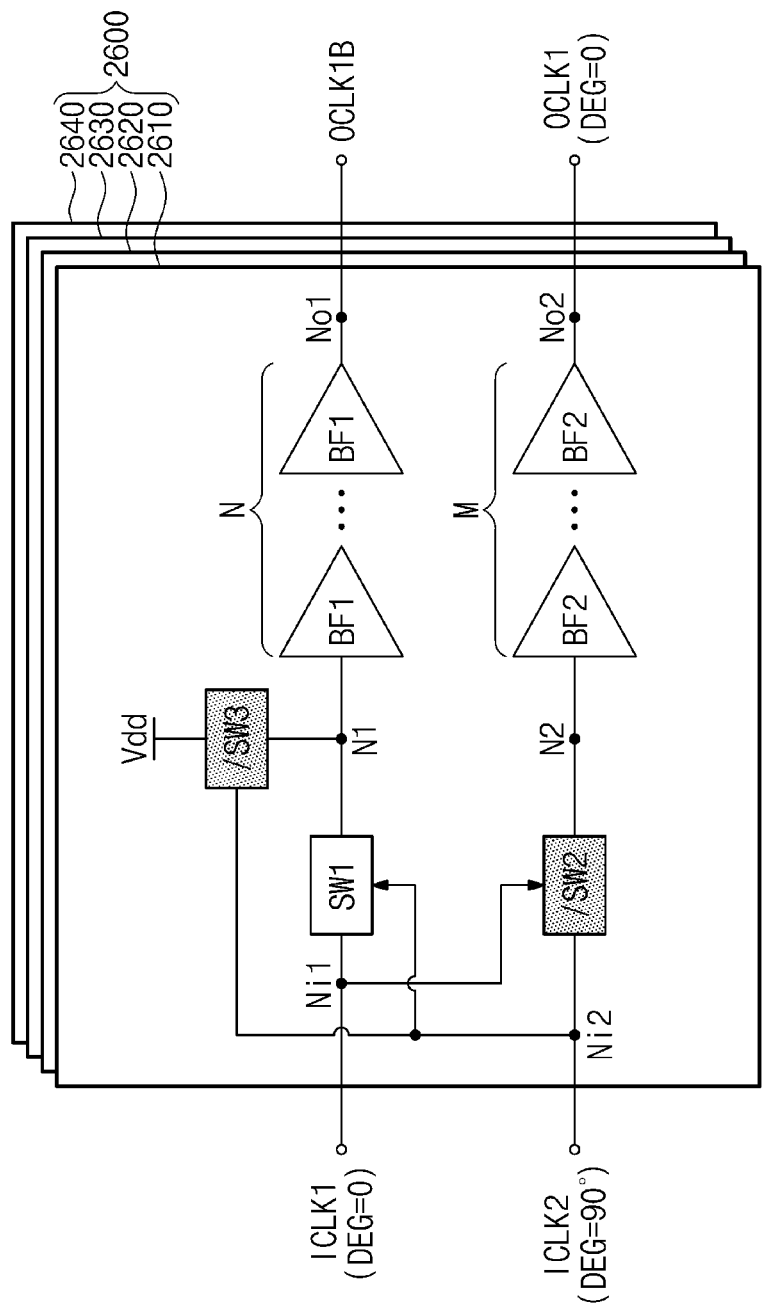
FIG. 17 is a block diagram illustrating a clock converting circuit including buffers according to an embodiment of the present disclosure in detail.

FIG. 17 is a block diagram illustrating a clock converting circuit 2600 including the buffers BF1 and BF2 according to an embodiment of the present disclosure in detail. Referring to FIG. 17, the clock converting circuit 2600 may include first to fourth clock circuits 2610 to 2640. Structures of the second to fourth clock circuits 2620 to 2640 may be similar to a structure of the first clock circuit 2610. For brevity of illustration, detailed structures of the second to fourth clock circuits 2620 to 2640 will be omitted.

The first clock circuit 2610 may include the switches SW1, /SW2, and /SW3, N first buffers BF1, and M second buffers BF2. Here, "N" and "M" are a natural number. The switches SW1, /SW2, and /SW3 are similar to the switches SW1, /SW2, and /SW3 of FIG. 12A, and thus, additional description will be omitted to avoid redundancy. The N first buffers BF1 and the M second buffers BF2 are similar to the N first buffers BF1 and the M second buffers BF2 of FIG. 10, and thus, additional description will be omitted to avoid redundancy.

Figure 18:
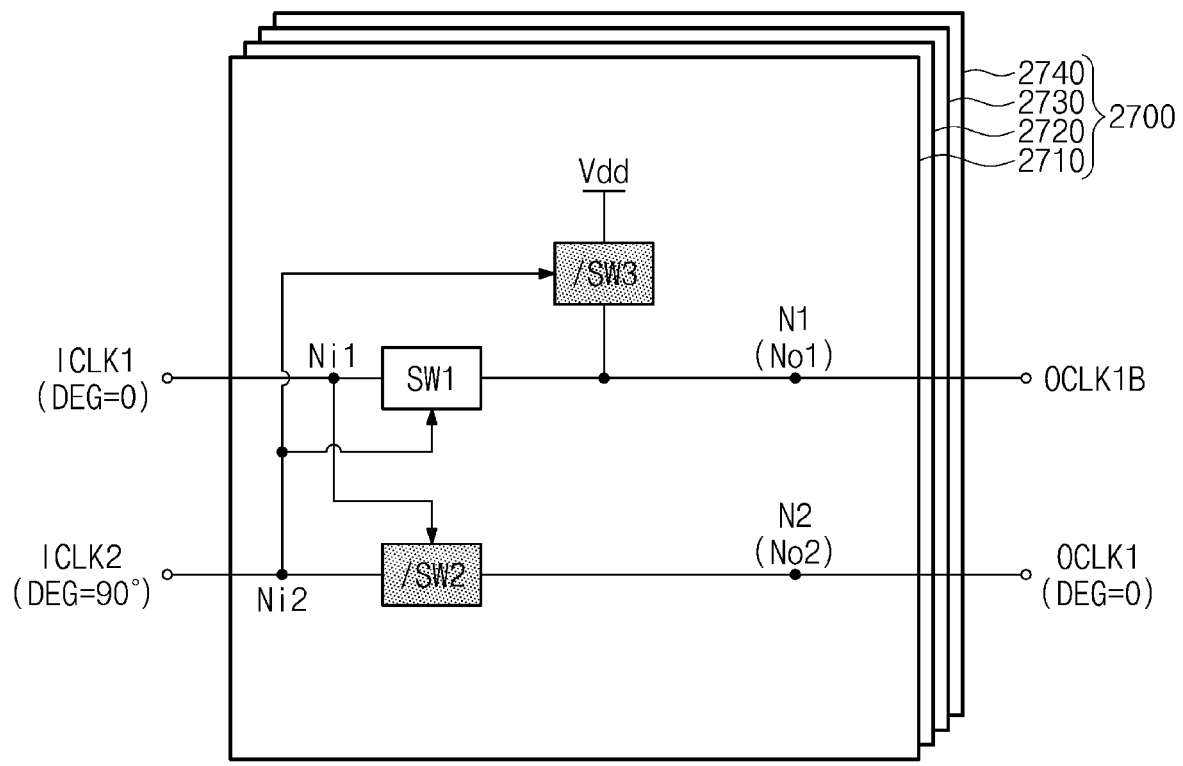
FIG. 18 is a block diagram illustrating a simplified clock converting circuit according to an embodiment of the present disclosure in detail.

FIG. 18 is a block diagram illustrating a clock converting circuit 2700 according to an embodiment of the present disclosure in detail. Referring to FIG. 18, the clock converting circuit 2700 may include first to fourth clock circuits 2710 to 2740. Structures of the second to fourth clock circuits 2720 to 2740 may be similar to a structure of the first clock circuit 2710. For brevity of illustration, detailed structures of the second to fourth clock circuits 2720 to 2740 will be omitted.

The first clock circuit 2710 may include the switches SW1, /SW2, and /SW3. The switches SW1, /SW2, and /SW3 are similar to the switches SW1, /SW2, and /SW3 of FIG. 12A, and thus, additional description will be omitted to avoid redundancy. Unlike the first clock circuit 2110 of FIG. 12A, the first clock circuit 2710 may not include the first inverter INV1 and the second inverter INV2. For example, in the first clock circuit 2710, the first node N1 may be short-circuited to the first output node No1, and the second node N2 may be short-circuited to the second output node No2.

As in the first clock circuit 1710 of FIG. 11, as the first inverter INV1 and the second inverter INV2 are omitted, the area of a semiconductor chip including the first clock circuit 2710 may be reduced. Also, power consumption of the first clock circuit 2710 may be reduced.

Figure 19:
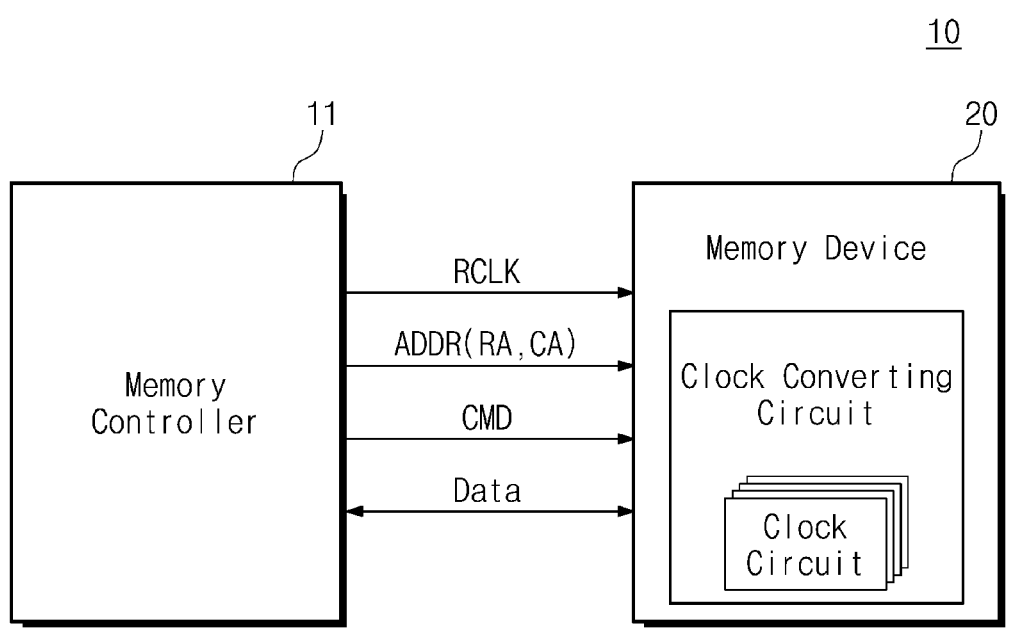
FIG. 19 is a block diagram illustrating a memory system according to an embodiment of the present disclosure.

FIG. 19 is a block diagram illustrating a memory system 10 according to an embodiment of the present disclosure. Referring to FIG. 19, the memory system 10 may include a memory controller 11 and a memory device 20. The memory controller 11 may transmit the reference clock RCLK, an address ADDR and a command CMD to the memory device 20 for the purpose of storing data in the memory device 20 or reading data stored in the memory device 20.

In an example embodiment, the address ADDR may include a row address RA and a column address CA. The command CMD may include an active command, a write command, a read command, or a precharge command. However, the present disclosure is not limited thereto. For example, the address ADDR may include various forms of addresses, and the command CMD may include various forms of commands.

Under control of the memory controller 11, the memory device 20 may store data received from the memory controller 11 or may transmit data stored therein to the memory controller 11.

In an example embodiment, the memory device 20 may be a dynamic random access memory (DRAM), and the memory controller 11 and the memory device 20 may communicate with each other based on a double data rate (DDR) interface. However, the present disclosure is not limited thereto. For example, the memory device 20 may be one of various memory devices such as a static random access memory (SRAM), a synchronous DRAM (SDRAM), a magnetic RAM (MRAM), a ferroelectric RAM (FRAM), a resistive RAM (ReRAM), and a phase-change RAM (PRAM), and the memory controller 11 and the memory device 20 may communicate with each other based on one of various interfaces such as low power DDR (LPDDR), universal serial bus (USB), modular multilevel converter (MMC), peripheral component interconnect (PCI), PCI express (PCI-E), advanced technology attachment (ATA), serial ATA (SATA), parallel ATA (PATA), small computer system interface (SCSI), enhanced standard (small/system) device interface (ESDI), and integrated drive electronics (IDE).

The memory device 20 may include a clock converting circuit. The clock converting circuit may include a plurality of clock circuits. In an example embodiment, the clock converting circuit of the memory device 20 may generate the first to fourth input clocks ICLK1 to ICLK4 having different phases, based on the reference clock RCLK. The clock converting circuit may generate the first to fourth output clocks OCLK1 to OCLK4 and the first to fourth inverted output clocks OCLK1B to OCLK4B based on the first to fourth input clocks ICLK1 to ICLK4. The first to fourth output clocks OCLK1 to OCLK4 may be clock signals having duties shorter than those of the first to fourth input clocks ICLK1 to ICLK4. In an example embodiment, the clock converting circuit of the memory device 20 may be one of the clock converting circuits 1100, 1200, 1300, 1400, 1500, 1600, 1700, 2100, 2200, 2300, 2400, 2500, 2600, and 2700 above described with reference to FIGS. 5A, 6, 7, 8, 9, 10, 11, 12A, 13, 14, 15, 16, 17, and 18.

Figure 20:
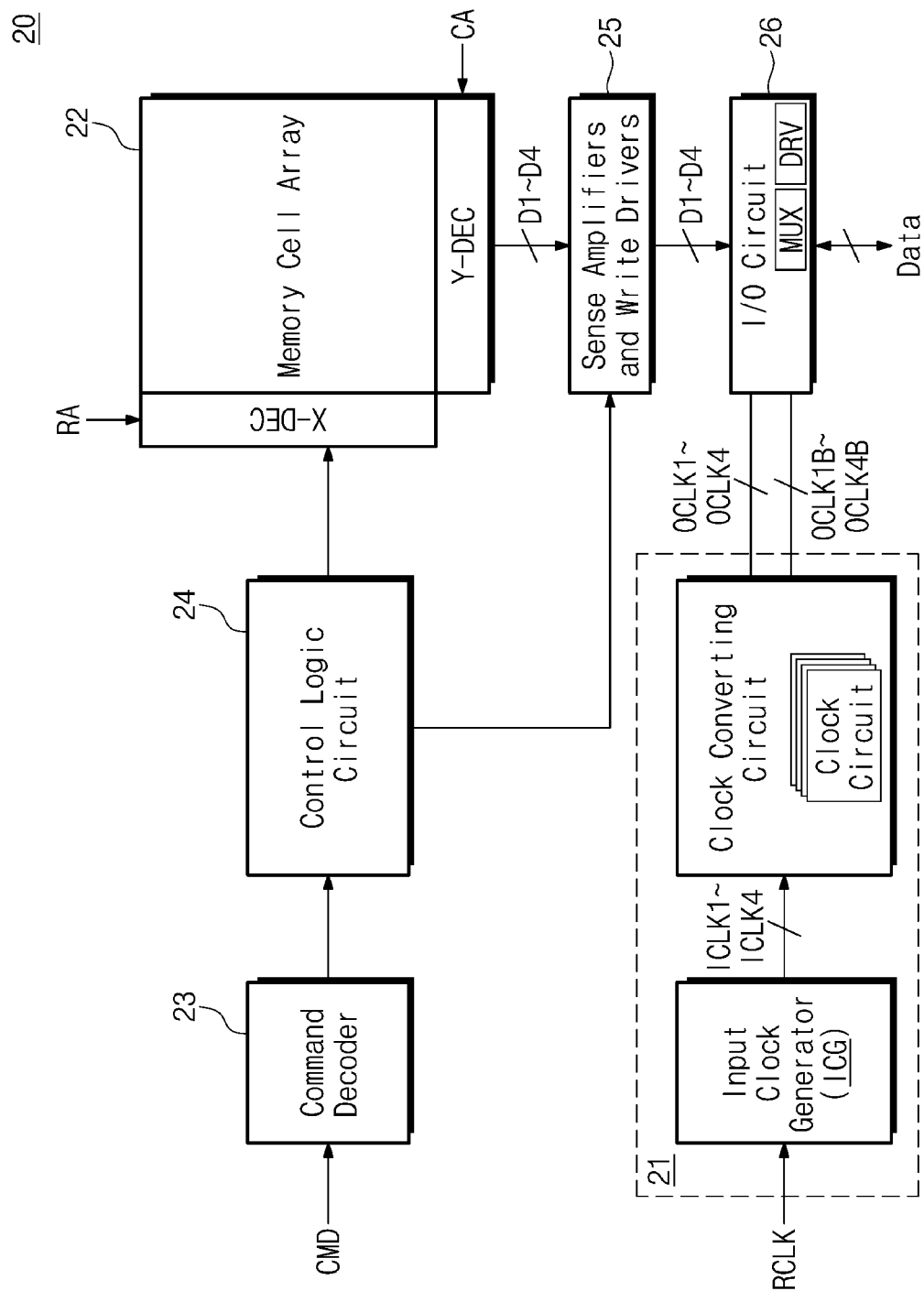
FIG. 20 is a block diagram illustrating a memory device of FIG. 19 according to example embodiments in detail.

FIG. 20 is a block diagram illustrating the memory device 20 of FIG. 19 in detail according to example embodiments. Referring to FIGS. 19 and 20, the memory device 20 may include a clock generator 21, a memory cell array 22, a command decoder 23, a control logic circuit 24, sense amplifiers and write drivers 25, and an input/output (I/O) circuit 26.

The clock generator 21 may include the input clock generator ICG and a clock converting circuit. The input clock generator ICG may generate the first to fourth input clocks ICLK1 to ICLK4 based on the reference clock RCLK. The clock converting circuit may include a plurality of clock circuits. For example, the clock converting circuit may include first to fourth clock circuits. The plurality of clock circuits of the clock converting circuit may generate the first to fourth output clocks OCLK1 to OCLK4 and the first to fourth inverted output clocks OCLK1B to OCLK4B based on the first to fourth input clocks ICLK1 to ICLK4.

The memory cell array 22 may include a plurality of memory cells. A plurality of memory cells may be connected to word lines and bit lines. The word lines may be connected to a X-decoder X-DEC, and the bit lines may be connected a Y-decoder Y-DEC.

The control logic circuit 24 may control components of the memory device 20 based on a decoding result from the command decoder 23. For example, in the case where the decoding result of the command decoder 23 indicates that a received command CMD is an active command, the control logic circuit 24 may control the X-decoder X-DEC such that a word line corresponding to the row address RA received together with the active command is enabled. In this case, first to fourth data D1 to D4 stored in memory cells connected with the enabled word line may be set to the sense amplifiers and write drivers 25. In the case where the decoding result of the command decoder 23 indicates that the received command CMD is a read command, the control logic circuit 24 may allow the sense amplifiers and write drivers 25 to sense the first to fourth data D1 to D4 from bit lines corresponding to the column address CA received together with the read command.

The input/output circuit 26 may include a multiplexer MUX and a driver DRV. The input/output circuit 26 may generate a data signal based on the first to fourth data D1 to D4, the first to fourth output clocks OCLK1 to OCLK4, and the first to fourth inverted output clocks OCLK1B to OCLK4B. A structure and a characteristic of the input/output circuit 26 will be described with reference to FIGS. 21 and 22.

Figure 21:
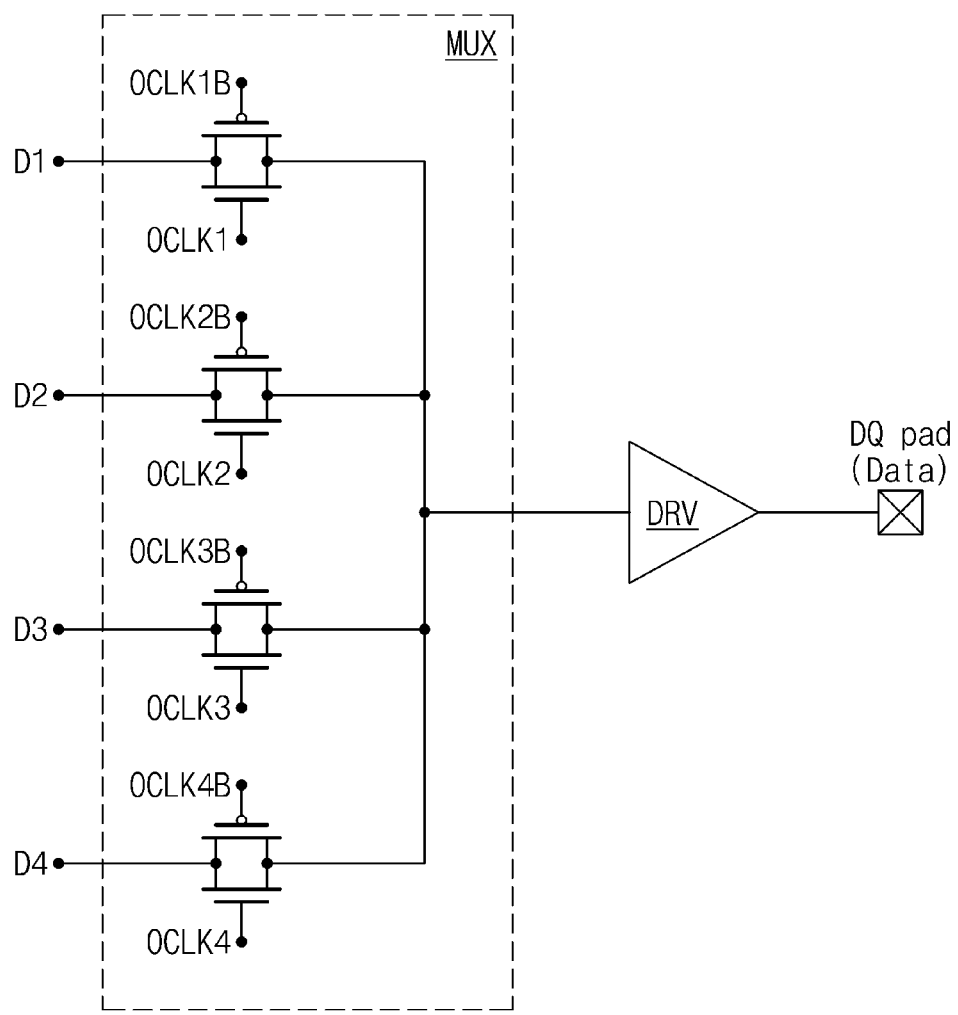
FIG. 21 is a circuit diagram illustrating an input/output circuit of FIG. 20 according to example embodiments in detail.

FIG. 21 is a circuit diagram illustrating the input/output (I/O) circuit 26 of FIG. 20 in detail according to example embodiments. Referring to FIG. 21, the input/output circuit 26 may include the multiplexer MUX and the driver DRV. The multiplexer MUX may include a first MUX NMOS transistor and a first MUX PMOS transistor connected in parallel between a node for receiving the first data D1 and the driver DRV. The first MUX NMOS transistor may operate in response to the first output clock OCLK1. The first MUX PMOS transistor may operate in response to the first inverted output clock OCLK1B.

The multiplexer MUX may further include a second MUX NMOS transistor and a second MUX PMOS transistor connected in parallel between a node for receiving the second data D2 and the driver DRV. The second MUX NMOS transistor may operate in response to the second output clock OCLK2. The second MUX PMOS transistor may operate in response to the second inverted output clock OCLK2B.

The multiplexer MUX may further include a third MUX NMOS transistor and a third MUX PMOS transistor connected in parallel between a node for receiving the third data D3 and the driver DRV. The third MUX NMOS transistor may operate in response to the third output clock OCLK3. The third MUX PMOS transistor may operate in response to the third inverted output clock OCLK3B.

The multiplexer MUX may further include a fourth MUX NMOS transistor and a fourth MUX PMOS transistor connected in parallel between a node for receiving the fourth data D4 and the driver DRV. The fourth MUX NMOS transistor may operate in response to the fourth output clock OCLK4. The fourth MUX PMOS transistor may operate in response to the fourth inverted output clock OCLK4B.

The driver DRV may be connected between the multiplexer MUX and a DQ pad. The DQ pad may be a pad where a data signal is generated. The driver DRV may generate the data signal at the DQ pad based on the first to fourth data D1 to D4 provided from the multiplexer MUX for respective time intervals.

Figure 22:
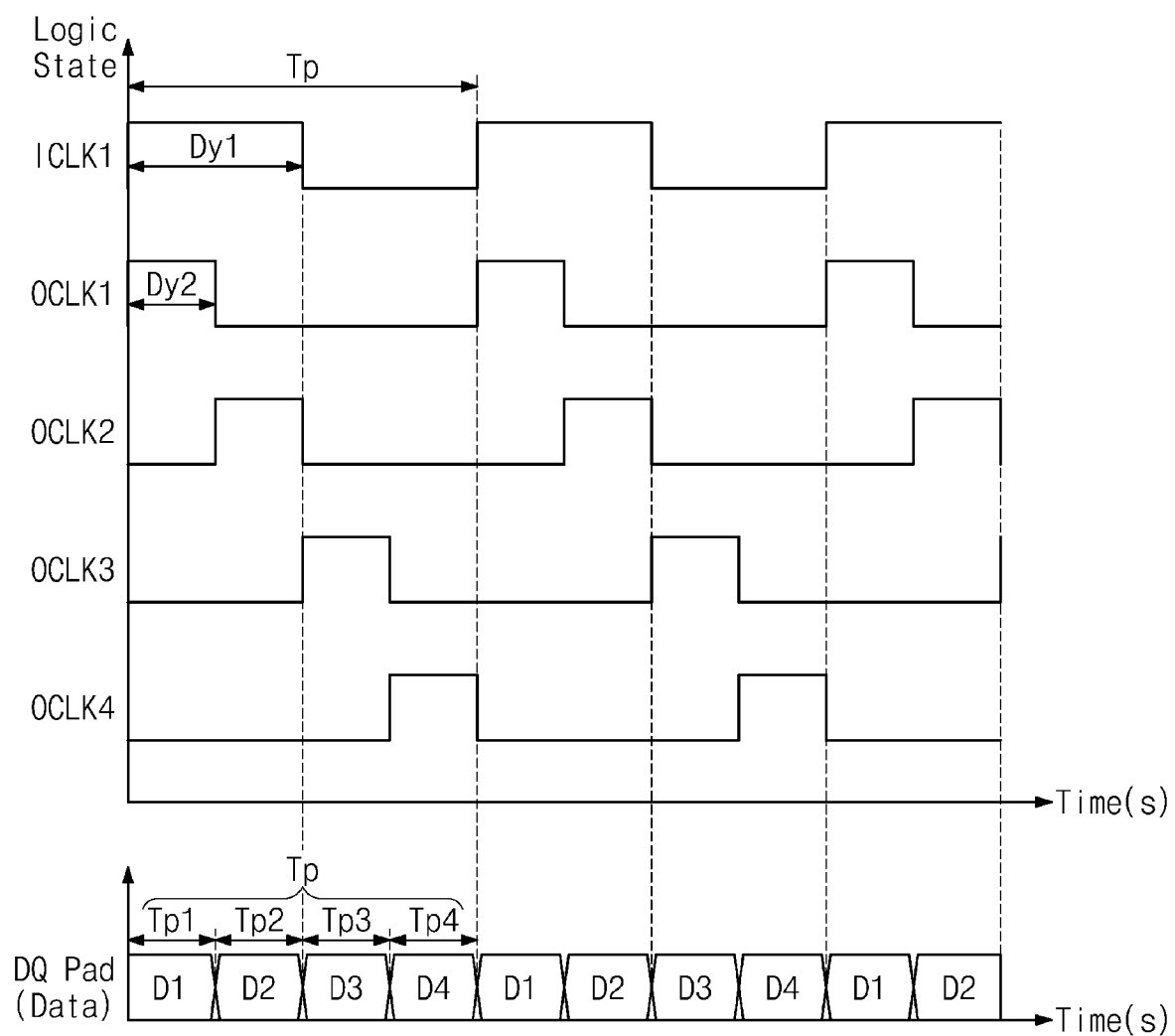
FIG. 22 is a graph illustrating a data signal generated at a DQ pad of FIG. 21 according to example embodiments.

FIG. 22 is a graph illustrating a data signal generated at a DQ pad of FIG. 21 according to example embodiments. A waveform of the first input clock ICLK1, waveforms of the first to fourth output clocks OCLK1 to OCLK4, and a waveform of a data signal of the DQ pad are illustrated in FIG. 22. In the graph of FIG. 22, a transverse direction represents a time and a longitudinal direction represents a logic state or data.

The first input clock ICLK1 may have the period Tp and the duty Dy1. The first output clock OCLK1 may have the period Tp and the duty Dy2. The duty Dy2 may be shorter than the duty Dy1. For example, the duty Dy1 may be 50%, and the duty Dy2 may be 25%. The second to fourth output clocks OCLK2 to OCLK4 may be signals that are delayed with respect to a phase of the first output clock OCLK1 as much as 90 degrees, 180 degrees, and 270 degrees, respectively.

In an example embodiment, the input/output circuit 26 may generate a data signal of the DQ pad based on the first to fourth output clocks OCLK1 to OCLK4 and the first to fourth data D1 to D4. For example, the period Tp may include the first to fourth time intervals Tp1 to Tp4. The first to fourth time intervals Tp1 to Tp4 may correspond to the first to fourth output clocks OCLK1 to OCLK4, respectively. The input/output circuit 26 may generate a data signal, which includes the first data D1 in the first time interval Tp1, includes the second data D2 in the second time interval Tp2, includes the third data D3 in the third time interval Tp3, and includes the fourth data D4 in the fourth time interval Tp4, based on the first to fourth output clocks OCLK1 to OCLK4 and the first to fourth data D1 to D4.

Figure 23:
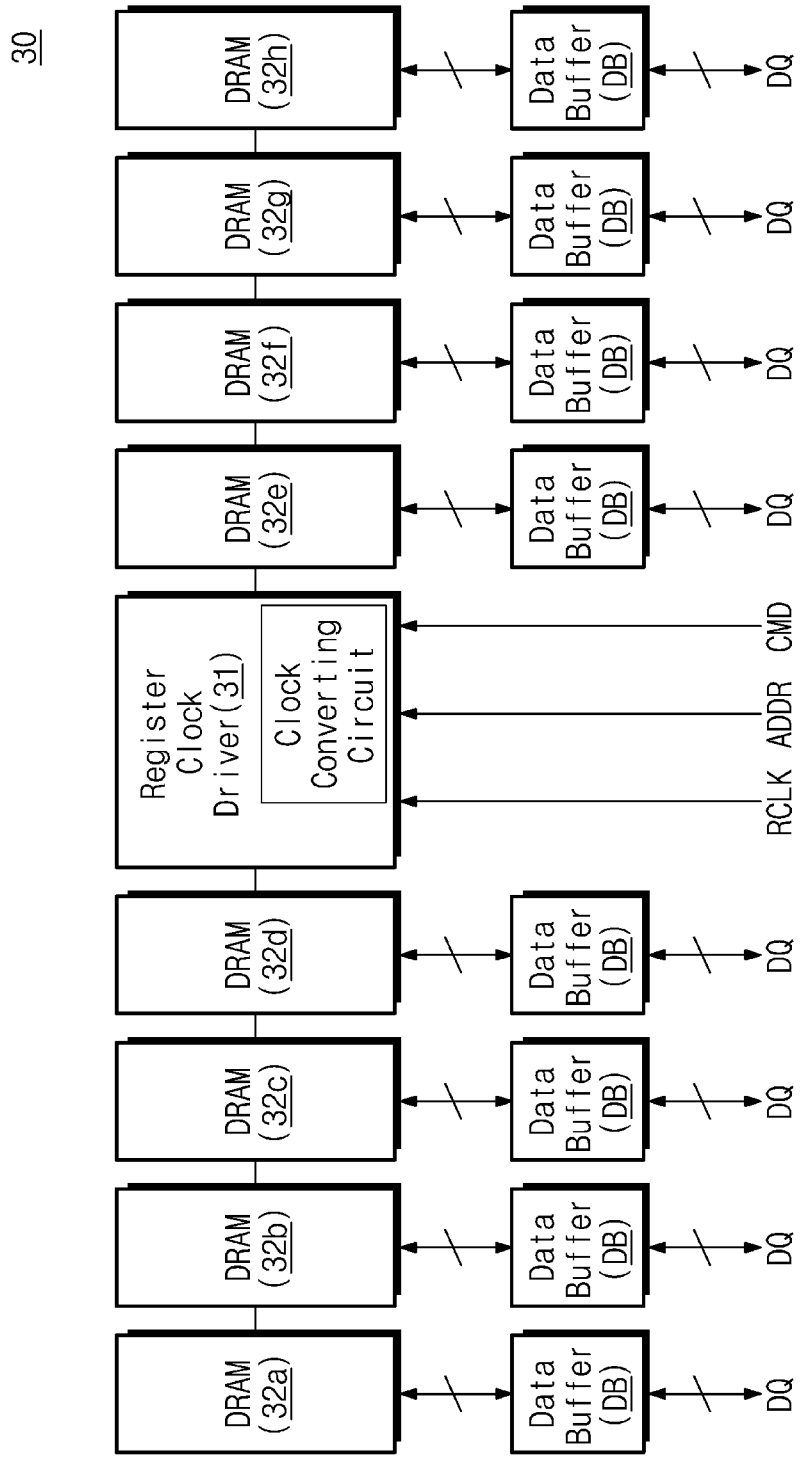
FIG. 23 is a block diagram illustrating a memory module according to an embodiment of the present disclosure.

FIG. 23 is a block diagram illustrating the memory module 30 according to an embodiment of the present disclosure. Referring to FIG. 23, a memory module 30 may include a register clock driver 31, a plurality of DRAMs 32a to 32h, and a plurality of data buffers DB.

The register clock driver 31 may receive the reference clock RCLK, the address ADDR, and the command CMD from an external device (e.g., a host or a memory controller). The register clock driver 31 may include a clock converting circuit. A characteristic and a structure of the clock converting circuit is similar to that of the clock converting circuit of the memory device 20 of FIG. 19, and thus, additional description will be omitted to avoid redundancy. For example, the clock converting circuit of the register clock driver 31 may be one of the clock converting circuits 1100, 1200, 1300, 1400, 1500, 1600, 1700, 2100, 2200, 2300, 2400, 2500, 2600, and 2700 above described with reference to FIGS. 5A, 6, 7, 8, 9, 10, 11, 12A, 13, 14, 15, 16, 17, and 18. Based on the received signals RCLK, ADDR, and CMD, the register clock driver 31 may transfer the address ADDR and the command CMD to the plurality of DRAMs 32a to 32h and may control the plurality of data buffers DB.

The plurality of DRAMs 32a to 32h may be respectively connected to the corresponding data buffers DB. Each of the plurality of DRAMs 32a to 32h may provide data stored therein to the corresponding data buffer DB or may be provided with data from the corresponding data buffer DB. Each of the plurality of data buffers DB may exchange data signals with the external device (e.g., a host or a memory controller) through the corresponding DQ pad.

Figure 24:
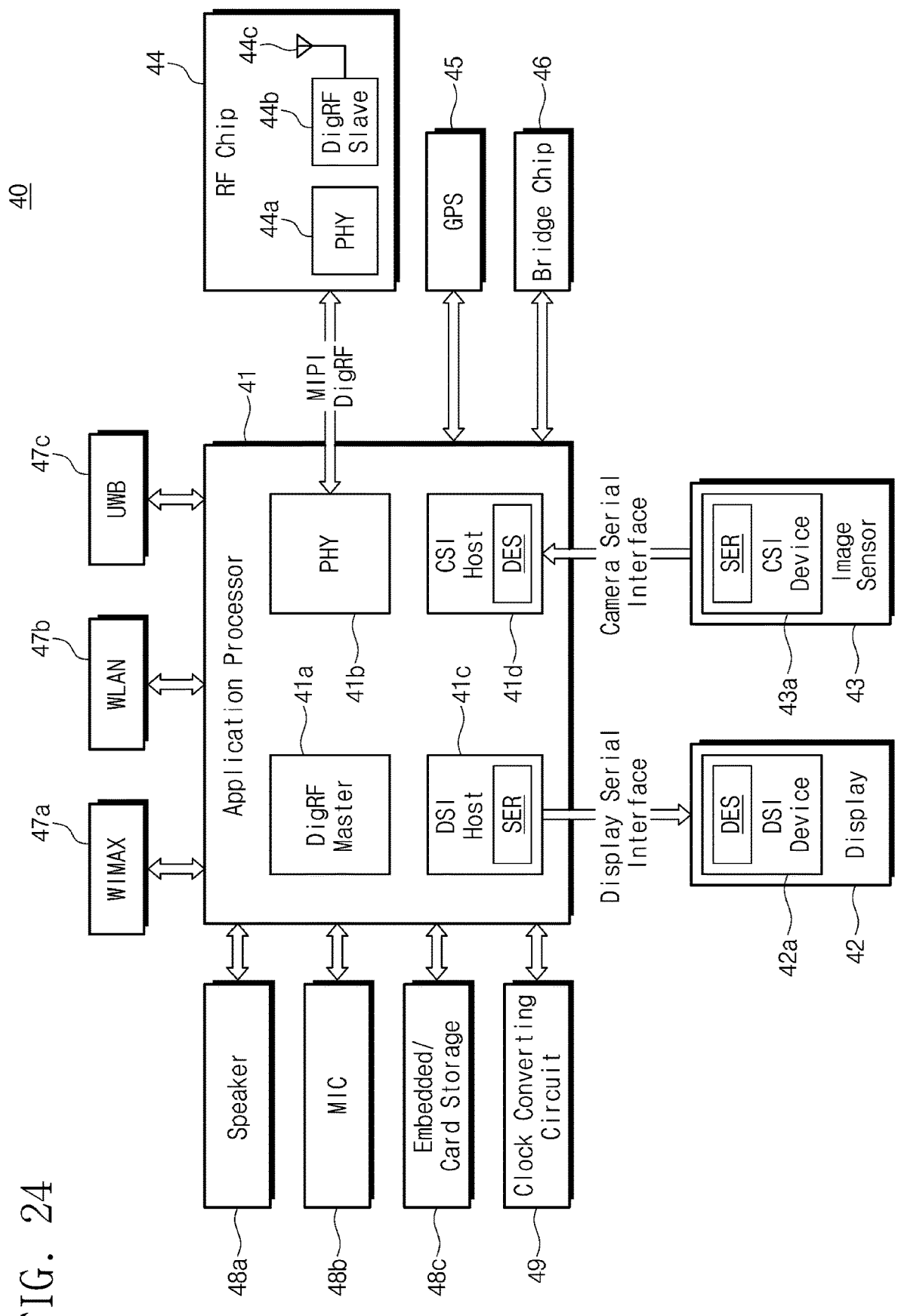
FIG. 24 is a block diagram illustrating an electronic system according to an embodiment of the present disclosure.

FIG. 24 is a block diagram illustrating an electronic system 40 according to an embodiment of the present disclosure. Referring to FIG. 24, the electronic system 40 may be implemented in the form of a portable communication terminal, a personal digital assistant (PDA), a portable multimedia player (PMP), a smartphone, or a wearable device. Alternatively, the electronic system 40 may be implemented in the form of a computing system such as a personal computer, a server, a workstation, or a notebook computer The electronic system 40 may include an application processor 41 (or a central processing unit), a display 42, and an image sensor 43. The application processor 41 may include a DigRF master 41a, a physical layer 41b, a display serial interface (DSI) host 41c, and a camera serial interface (CSI) host 41d.

The DSI host 41c may communicate with a DSI device 42a of the display 42 through the DSI. In an example embodiment, an optical serializer SER may be implemented in the DSI host 41c. An optical deserializer DES may be implemented in the DSI device 42a.

The CSI host 41d may communicate with a CSI device 43a of the image sensor 43 through the CSI. In an example embodiment, an optical deserializer DES may be implemented in the CSI host 41d. An optical serializer SER may be implemented in the CSI device 43a.

The electronic system 40 may further include a radio frequency (RF) chip 44 for communicating with the application processor 41. The RF chip 44 may include a physical layer 44a, a DigRF slave 44b, and an antenna 44c. In an example embodiment, the physical layer 44a of the RF chip 44 and the physical layer 41b of the application processor 41 may exchange data with each other through an MIPI DigRF interface.

The electronic system 40 may further include a global positioning system (GPS) device 45 for processing position information. The electronic system 40 may further include a bridge chip 46 for managing connections between peripheral devices. The electronic system 40 may communicate with an external system through a worldwide interoperability for microwave access (WiMAX) 47a, a wireless local area network (WLAN) 47b, and an ultra-wideband (UWB) 47c.

The electronic system 40 may further include a speaker 48*a* and a microphone 48*b* for the purpose of processing voice information. The electronic system 40 may further include embedded/card storage 48*c* for storing data of the application processor 41.

The electronic system 40 may further include a clock converting circuit 49 that generates a clock signal to be used for data processing of the application processor 41. The clock converting circuit 49 may be similar to the clock converting circuit of the memory device 20 of FIG. 19. In an example embodiment, the clock converting circuit 49 may be one of the clock converting circuits 1100, 1200, 1300, 1400, 1500, 1600, 1700, 2100, 2200, 2300, 2400, 2500, 2600, and 2700 above described with reference to FIGS. 5A, 6, 7, 8, 9, 10, 11, 12A, 13, 14, 15, 16, 17, and 18.

According to the present disclosure, a clock converting circuit robust to a skew and a duty error is provided by matching edge types of input clocks used for duty converting and designing an output stage with a symmetric structure.

Also, a clock converting circuit robust to an external noise is provided by adding latch inverters. In addition, a clock converting circuit in which power consumption and the chip area decrease is provided by removing unnecessary inverters.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A clock converting circuit comprising:
a first switch directly connected between a first input node and a first node, and configured to operate in response to a first logic state of a first input clock, the first input node directly receiving a second input clock delayed with respect to the first input clock by 90 degrees;
a second switch directly connected between a second input node and a second node, and configured to operate in response to a second logic state of the second input clock, the second input node directly receiving the first input clock; and
a third switch connected between the second node and a ground node and configured to operate in response to a first logic state of the second input clock opposite to the second logic state of the second input clock.

2. The clock converting circuit of claim 1, further comprising:
a fourth switch connected between the first node and a power node and configured to operate in response to a second logic state of the first input clock opposite to the first logic state of a first input clock.

3. The clock converting circuit of claim 1, further comprising:
a fourth switch connected between a third input node for receiving a third input clock delayed with respect to the first input clock as much as 180 degrees and a third node and configured to operate in response to the first logic state of the second input clock;
a fifth switch connected between the first input node and a fourth node and configured to operate in response to a second logic state of the third input clock;
a sixth switch connected between the fourth node and the ground node and configured to operate in response to a first logic state of the third input clock opposite to the second logic state of the third input clock;
a seventh switch connected between a fourth input node for receiving a fourth input clock delayed with respect to the first input clock as much as 270 degrees and a fifth node and configured to operate in response to the first logic state of the third input clock;
an eighth switch connected between the third input node and a sixth node and configured to operate in response to a second logic state of the fourth input clock;
a ninth switch connected between the sixth node and the ground node and configured to operate in response to a first logic state of the fourth input clock opposite to the second logic state of the fourth input clock;
a tenth switch connected between the second input node and a seventh node and configured to operate in response to the first logic state of the fourth input clock;
an eleventh switch connected between the fourth input node and an eighth node and configured to operate in response to a second logic state of the first input clock opposite to the first logic state of the first input clock; and
a twelfth switch connected between the eighth node and the ground node and configured to operate in response to the first logic state of the first input clock.

4. The clock converting circuit of claim 3, further comprising:
a thirteenth switch connected between the first node and a power node and configured to operate in response to the second logic state of the first input clock;
a fourteenth switch connected between the third node and the power node and configured to operate in response to the second logic state of the second input clock;
a fifteenth switch connected between the fifth node and the power node and configured to operate in response to the second logic state of the third input clock; and
a sixteenth switch connected between the seventh node and the power node and configured to operate in response to the second logic state of the fourth input clock.

5. The clock converting circuit of claim 1, wherein the first switch includes a first transmission gate configured to operate in response to the first input clock and a third input clock,
wherein the second switch includes a second transmission gate configured to operate in response to the second input clock and a fourth input clock,
wherein the third input clock is delayed with respect to the first input clock as much as 180 degrees, and
wherein the fourth input clock is delayed with respect to the first input clock as much as 270 degrees.

6. The clock converting circuit of claim 5, wherein the first transmission gate includes:
a first NMOS transistor connected between the first input node and the first node and configured to operate in response to the first input clock; and
a first PMOS transistor connected between the first input node and the first node and configured to operate in response to the third input clock, and
wherein the second transmission gate includes:
a second NMOS transistor connected between the second input node and the second node and configured to operate in response to the fourth input clock; and
a second PMOS transistor connected between the second input node and the second node and configured to operate in response to the second input clock.

7. The clock converting circuit of claim 6, further comprising:

a fourth switch connected between the first node and a power node and configured to operate in response to a second logic state of the first input clock opposite to the first logic state of the first input clock,
wherein the third switch includes:
a third NMOS transistor connected between the second node and the ground node and configured to operate in response to the second input clock, and
wherein the fourth switch includes:
a third PMOS transistor connected between the first node and the power node and configured to operate in response to the first input clock.

8. The clock converting circuit of claim 1, further comprising:
a first inverter configured to invert a voltage of the first node and to output a first output clock; and
a second inverter configured to invert a voltage of the second node and to output a first inverted output clock opposite to the first output clock.

9. The clock converting circuit of claim 1, further comprising:
a first latch inverter configured to invert a voltage of the first node and to output an inverted voltage of the first node to the second node; and
a second latch inverter configured to invert a voltage of the second node and to output an inverted voltage of the second node to the first node.

10. The clock converting circuit of claim 1, further comprising:
N first buffers connected in series between the first node and a first output node of generating a first inverted output clock; and
M second buffers connected in series between the second node and a second output node of generating a first output clock opposite to the first inverted output clock, and
wherein the "N" and the "M" are natural numbers.

11. The clock converting circuit of claim 10, wherein the "N" is equal to the "M".

12. The clock converting circuit of claim 10, wherein a first time interval taken for the N first buffers to transfer a voltage of the first node to the first output node is equal to a second time interval taken for the M second buffers to transfer a voltage of the second node to the second output node.

13. A clock converting circuit comprising:
first to fourth clock circuits configured to generate an output four-phase clock including first to fourth output clocks, based on an input four-phase clock including first to fourth input clocks,
wherein the first clock circuit includes:
a first switch connected between a first input node and a first node, and configured to output a first pre-output clock on the first node in response to a first logic state of the first input clock, the first input node directly receiving the second input clock;
a second switch connected between a second input node and a second node, and configured to output a second pre-output clock on the second node in response to a second logic state of the second input clock, the second input node directly receiving the first input clock;
a third switch connected between the second node and a ground node, and configured to operate in response to a first logic state of the second input clock opposite to the second logic state of the second input clock;
a first inverter connected to the first node, and configured to invert the first pre-output clock and output a first output clock; and
a second inverter connected to the second node, and configured to invert the second pre-output clock and output a second output clock opposite to the first output clock,
wherein each of the first and second pre-output clocks is a periodic signal,
wherein a logic state of the first pre-output clock is opposite to a logic state of the second pre-output clock for one period, and
wherein the first and second output clocks are output in response to only rising edges of the first and second input clocks.

14. The clock converting circuit of claim 13, wherein the first clock circuit is configured to generate the first output clock and a first inverted output clock opposite to the first output clock based on the first and second input clocks,
wherein the second clock circuit is configured to generate the second output clock and a second inverted output clock opposite to the second output clock based on the second and third input clocks,
wherein the third clock circuit is configured to generate the third output clock and a third inverted output clock opposite to the third output clock based on the third and fourth input clocks, and
wherein the fourth clock circuit is configured to generate the fourth output clock and a fourth inverted output clock opposite to the fourth output clock based on the fourth and first input clocks.

15. The clock converting circuit of claim 13, wherein the second input clock is delayed with respect to the first input clock as much as 90 degrees,
wherein the third input clock is delayed with respect to the first input clock as much as 180 degrees, and
wherein the fourth input clock is delayed with respect to the first input clock as much as 270 degrees.

16. A clock converting circuit comprising:
a first switch directly connected between a first input node and a first node for directly receiving a first input clock at the first input node and configured to operate in response to a first logic state of a second input clock delayed with respect to the first input clock by 90 degrees;
a second switch directly connected between a second input node and a second node for directly receiving the second input clock at the second input node and configured to operate in response to a second logic state of the first input clock; and
a third switch connected between the first node and a power node and configured to operate in response to a second logic state of the second input clock opposite to the first logic state of the second input clock,
wherein the power node is applied with a voltage higher than a ground voltage.

17. The clock converting circuit of claim 16, further comprising:
a fourth switch connected between the second node and a ground node and configured to operate in response to a first logic state of the first input clock opposite to the second logic state of the first input clock,
wherein the ground node is applied with the ground voltage.

18. The clock converting circuit of claim 16, further comprising:

a fourth switch connected between the second input node and a third node and configured to operate in response to a first logic state of a third input clock delayed with respect to the first input clock as much as 180 degrees;

a fifth switch connected between a third input node for receiving the third input clock and a fourth node and configured to operate in response to the second logic state of the second input clock;

a sixth switch connected between the third node and the power node and configured to operate in response to a second logic state of the third input clock opposite to the first logic state of the third input clock;

a seventh switch connected between the third input node and a fifth node and configured to operate in response to a first logic state of a fourth input clock delayed with respect to the first input clock as much as 270 degrees;

an eighth switch connected between a fourth input node for receiving the fourth input clock and a sixth node and configured to operate in response to the second logic state of the third input clock;

a ninth switch connected between the fifth node and the power node and configured to operate in response to a second logic state of the fourth input clock opposite to the first logic state of the fourth input clock;

a tenth switch connected between the fourth input node and a seventh node and configured to operate in response to a first logic state of the first input clock opposite to the second logic state of the first input clock;

an eleventh switch connected between the first input node and an eighth node and configured to operate in response to the second logic state of the fourth input clock; and a twelfth switch connected between the seventh node and the power node and configured to operate in response to the second logic state of the first input clock.

19. The clock converting circuit of claim 18, further comprising:

a thirteenth switch connected between the second node and a ground node and configured to operate in response to the first logic state of the first input clock;

a fourteenth switch connected between the fourth node and the ground node and configured to operate in response to the first logic state of the second input clock;

a fifteenth switch connected between the sixth node and the ground node and configured to operate in response to the first logic state of the third input clock; and a sixteenth switch connected between the eighth node and the ground node and configured to operate in response to the first logic state of the fourth input clock, wherein the ground node is applied with the ground voltage.

20. The clock converting circuit of claim 16, wherein the first switch includes a first transmission gate configured to operate in response to the second input clock and a fourth input clock, wherein the second switch includes a second transmission gate configured to operate in response to the first input clock and a third input clock, wherein the third input clock is delayed with respect to the first input clock as much as 180 degrees, and wherein the fourth input clock is delayed with respect to the first input clock as much as 270 degrees.

* * * * *